US007602862B2

(12) United States Patent
May et al.

(10) Patent No.: US 7,602,862 B2
(45) Date of Patent: Oct. 13, 2009

(54) MIXING MODULE AND METHODS FOR USE THEREWITH

(75) Inventors: Michael R. May, Austin, TX (US); Matthew D. Felder, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 651 days.

(21) Appl. No.: 11/237,344

(22) Filed: Sep. 28, 2005

(65) Prior Publication Data

US 2007/0071132 A1    Mar. 29, 2007

(51) Int. Cl.
*H03D 3/00* (2006.01)
*H03K 9/06* (2006.01)
*H03K 9/00* (2006.01)

(52) U.S. Cl. ..................... 375/322; 375/316
(58) Field of Classification Search .......... 375/329, 375/322, 316
See application file for complete search history.

(56) References Cited

U.S. PATENT DOCUMENTS 5,937,013 A * 8/1999 Lam et al. .......... 375/340

2006/0284754 A1* 12/2006 Garrity et al. .......... 341/172
2007/0040588 A1* 2/2007 Braswell et al. .......... 327/94

OTHER PUBLICATIONS

K. Muhammad, et al; A Discrete-Time Bluetooth Receiver in a 0.13pm Digital CMOS Process; ISSCC 2004/ Session 15/Wireless Consumer ICs/15.1 (p. 214-215); Texas Instruments, Dallas, Texas.
K. Muhammad, et al; A Discrete-Time Bluetooth Receiver in a 0.13pm Digital CMOS Process; ISSC 2004/ Session 15/Wireless Consumer ICs/15.1 (pp. 268, 269 & 1 pg.-paper continuation); Texas Instruments, Dallas, Texas.

* cited by examiner

*Primary Examiner*—David C Payne
*Assistant Examiner*—Brina J Stevens
(74) *Attorney, Agent, or Firm*—Gary R. Stanford

(57) ABSTRACT

A mixing module includes a plurality of switched sample modules operably for generating a corresponding plurality of samples of an analog input signal in response to a control signal. A control module generates a mixing sequence and a control signal based on the mixing sequence, the control signal including a sequence of sample positions at a sampling clock rate and a sequence of scale factors, the sequence of scale factors based on an oscillation, wherein the sampling clock has a sample period and wherein the sequence of sample positions repeats at a sample position period greater than a sample interval, the sample interval equal to the sample period times the number of the plurality of switched sample circuits.

34 Claims, 23 Drawing Sheets

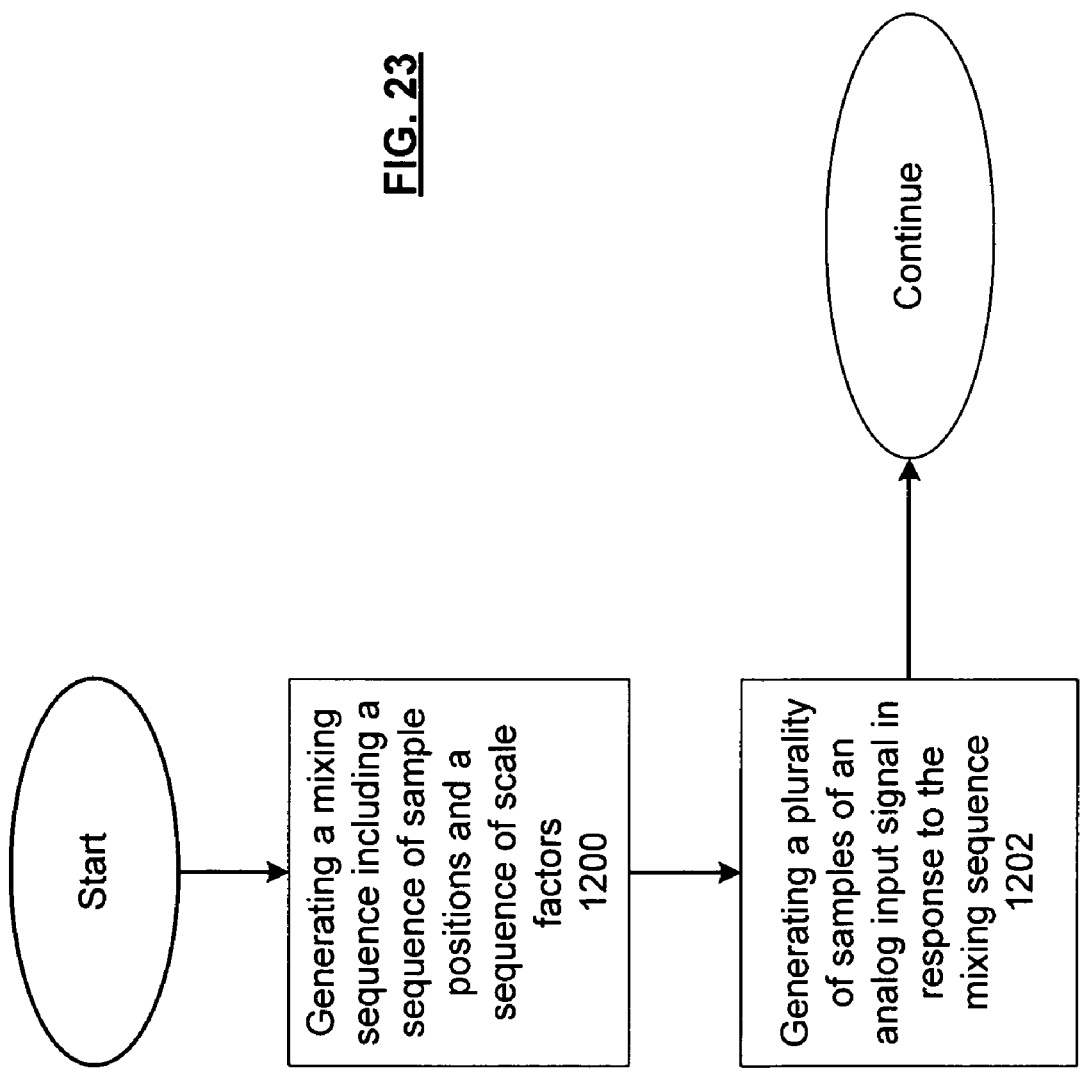

MIXING MODULE AND METHODS FOR USE THEREWITH

CROSS REFERENCE TO RELATED PATENTS

The present application is related to the following U.S. patent application that is contemporaneously filed and commonly assigned:

Receiver and methods for use therewith, having Ser. No., 11/237,339; the contents of which is expressly incorporated herein in its entirety by reference thereto.

TECHNICAL FIELD OF THE INVENTION

The present invention relates to receivers and mixers and related methods used in devices such as radio receivers.

DESCRIPTION OF RELATED ART

Radio receivers can be implemented in integrated circuits that can provide an entire receiver front end on a single chip. One concern in the design of these circuits is the amount of noise that is produced. When implemented in a radio receiver, it is desirable for the noise of these circuits to be as low as possible. Digital circuit designs can reduce the amount of analog noise, such as thermal noise that is introduced. However, other sources of noise can be present. The presence of periodic switching events within the frequency band of the input circuitry can cause undesirable spurs. Further, circuit imbalances can introduce extraneous signals, lower the performance of receiver components, and create undesirable frequency spurs and harmonics in the design.

The need exists for a low noise radio receiver that can be implemented efficiently on an integrated circuit.

BRIEF DESCRIPTION OF THE SEVERAL VIEWS OF THE DRAWINGS

FIG. 23 presents a flowchart representation of a method in accordance with an embodiment of the present invention.

DETAILED DESCRIPTION OF THE INVENTION INCLUDING THE PRESENTLY PREFERRED EMBODIMENTS

The embodiments of the present invention yield several advantages over the prior art. In an embodiment of the present inventions the harmonics of switching rates of certain intermediate signals are chosen to avoid the frequency band of the desired received signal so as to reduce unwanted mix products that degrade signal quality. In a further embodiment of the present invention, circuit imbalances are corrected by having circuit elements performing alternating functions. In particular, these and other advantages will be evident to one of ordinary skill of the art, based on the teachings presented herein.

Figure 1:
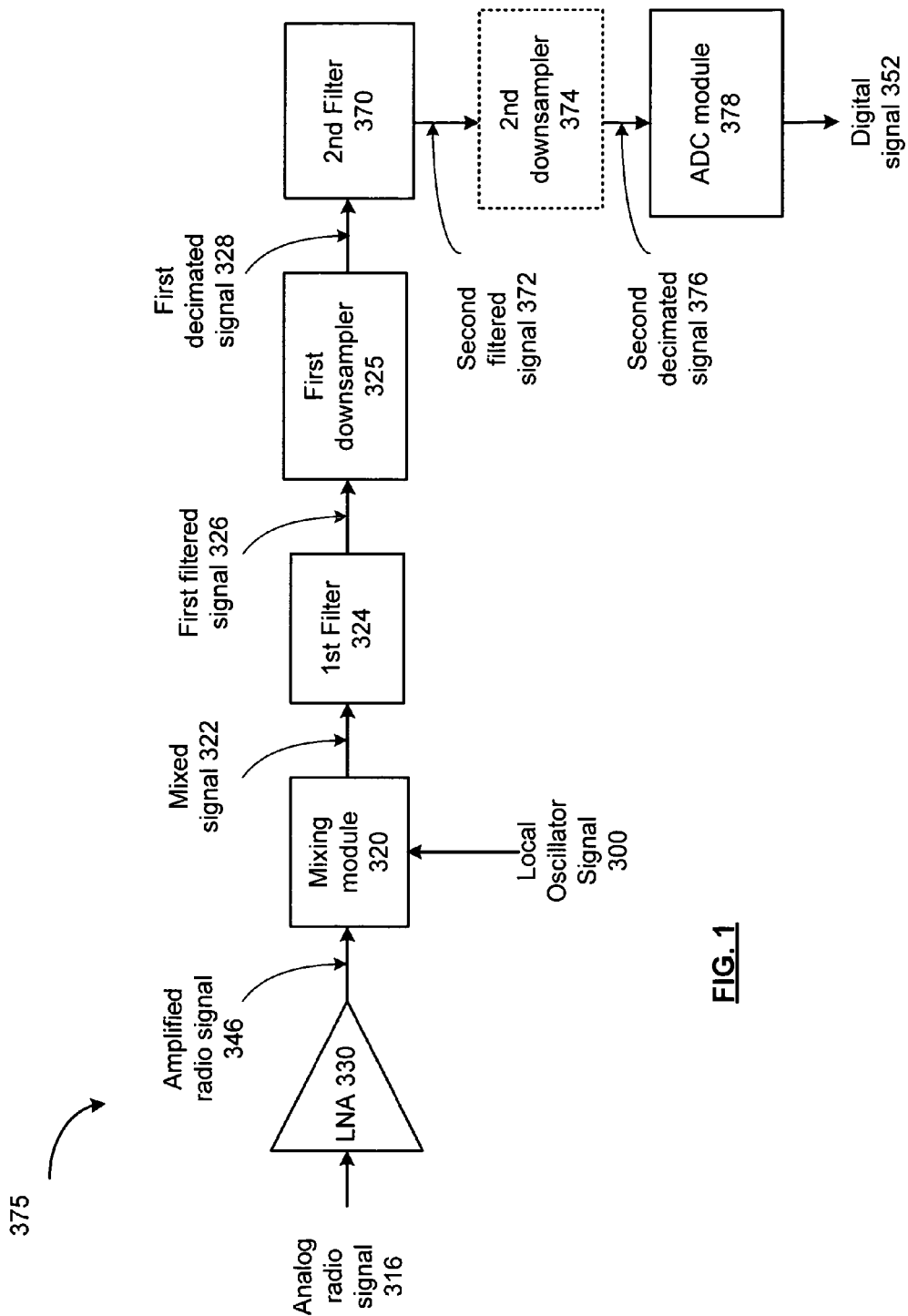
FIG. 1 presents a block diagram of a radio receiver front end in accordance with an embodiment of the present invention.

FIG. 1 presents a block diagram of a radio receiver front end in accordance with an embodiment of the present invention. In particular, the radio receiver front end 375 converts an analog radio signal 316 into a digital signal 352. A low noise amplifier 330 amplifies the analog radio signal 316 to produce an amplified radio signal 346. A mixing module 320 is operably coupled to the amplified radio signal 346 and the local oscillator signal 300 for mixing the amplified radio signal 346 by at least one mixing sequence to produce a mixed signal 322, the at least one mixing sequence having a mixing period based on the local oscillator signal 300.

First filter 324 filters the mixed signal 322 to produce a first filtered signal 326 and first downsampler 325 down samples the first filtered signal 326 by a factor of N to produce first decimated signal 328. In an embodiment of the present invention, the down sampling of the first filtered signal 326 has a decimation period and the decimation period is not a multiple of the mixing period. In this fashion, the fundamental frequency and harmonics of the sample rate of the first decimated signal will not be within the passband of the low noise amplifier 330, as will be discussed in further detail in conjunction with the figures that follow.

In an embodiment of the present invention, first filter 324 and first downsampler 325 are implemented in analog circuitry. In an embodiment, first filter 324 is a finite impulse response (FIR) filter that serves to provide anti-aliasing filtration, prior to the down-sampling operation of first downsampler 325. In this embodiment, first filtered signal 326 is calculated based on the sum of a finite number of weighted past values of mixed signal 322. In alternative embodiments of the present invention, different types of filters could be used. Other embodiments include infinite impulse response (IIR) filters, half band filters, and Butterworth filters.

Second filter 370 filters the first decimated signal 328 to produce a second filtered signal 372. Optional second downsampler 374 decimates the second filtered signal by a factor of M to produce a second decimated signal 376. An analog to digital converter (ADC) module 378 converts the second decimated signal 376 to produce a digital signal 352.

In an embodiment of the present invention, second filter 370 and second downsampler 374 are implemented in analog circuitry. In an embodiment second filter 370 is an infinite impulse response (IIR) filter that serves to provide anti-aliasing filtration, prior to the down-sampling operation of second downsampler 374. In alternative embodiments of the present invention, different types of filters could be used. Other embodiments include FIR filters, half band filters, and Butterworth filters. In still other embodiments, second downsampler 374 can be eliminated and ADC 378 can perform analog to digital conversion on second filtered signal 372.

Figure 2:
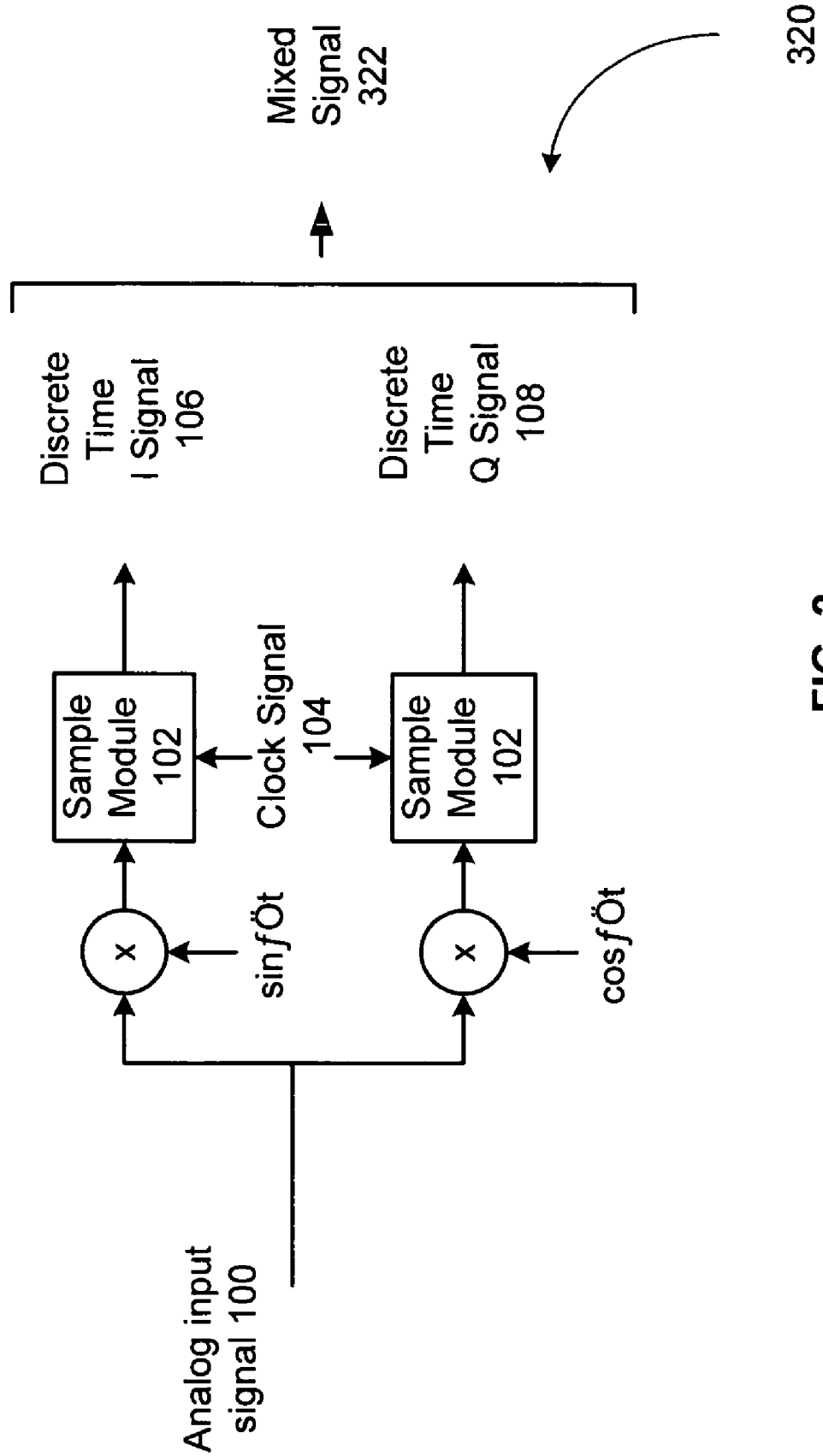
FIG. 2 presents a block diagram representation of a mixing module in accordance with an embodiment of the present invention.

FIG. 2 presents a block diagram representation of a mixing module in accordance with an embodiment of the present invention. In this embodiment, mixing module 320 produces a mixed signal 322 that is a discrete time signal having an in-phase (I) component, discrete time I signal 106, and quadrature phase (Q) component, discrete time Q signal 108. In this embodiment, analog input signal 100, such as amplified radio signal 346, is multiplied by sinusoidal and cosinusoidal signals at the same frequency, such as the frequency of local oscillator signal 300. Each of these signals is sampled by a respective sampling module 102 to produce the I and Q component of mixed signal 322. In this embodiment of the present invention, sample modules 102 are each clocked by clock signal 104 at a frequency that is greater than twice the highest frequency of input signal 100. In a further embodiment of the present invention, the clock signal frequency is approximately four-times the frequency of the input signal 100.

Figure 3:
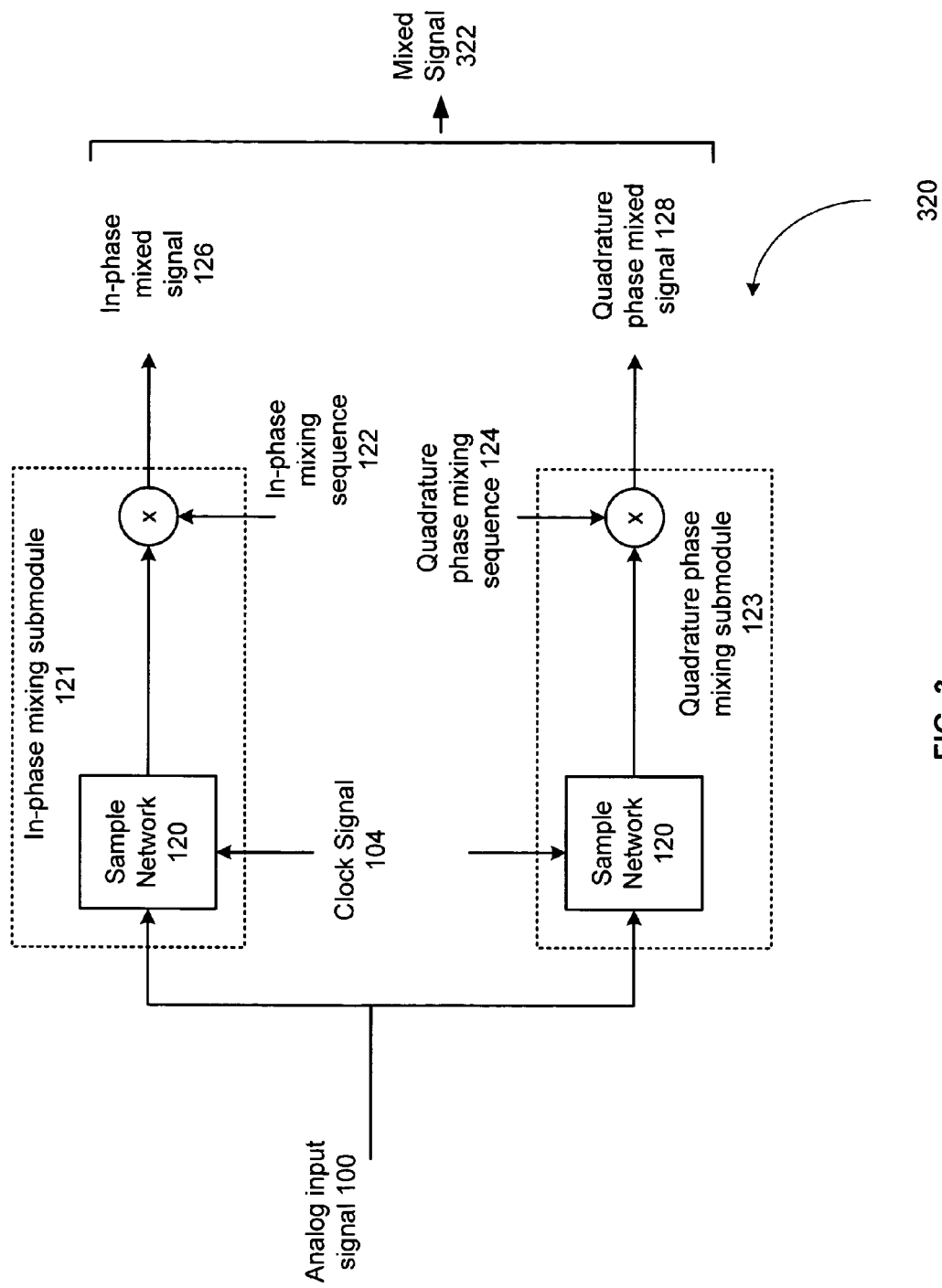
FIG. 3 presents a block diagram representation of a mixing module in accordance with a further embodiment of the present invention.

FIG. 3 presents a block diagram representation of a mixing module in accordance with a further embodiment of the present invention. In this embodiment, the functionalities of mixing and sampling of analog input signal 100 are combined. Sample networks 120 directly produce a mixed signal 322 that includes a discrete time I signal such as in-phase mixed signal 126 and a discrete time Q signal such as quadrature phase mixed signal 128, based on clock signal 104 and further based on at least one mixing sequence. In accordance with this embodiment of the present invention, the mixing sequence includes an in-phase mixing sequence 122 and a quadrature phase mixing sequence 124, and wherein the mixing module 320 includes an in-phase mixing submodule 121 for mixing the analog input signal 100 by the in-phase mixing sequence 122 to produce the in-phase mixed signal 126 and a quadrature phase mixing submodule 123 for mixing the analog input signal 100 by the quadrature phase mixing sequence 124 to produce the quadrature phase mixed signal 128.

Further, in accordance with this embodiment, the first filtered signal 326 includes an in-phase first filtered signal and a quadrature phase first filtered signal, and wherein the first filter 324 includes a in-phase first filter submodule for filtering the in-phase mixed signal 126 to produce the in-phase first filtered signal and a quadrature phase first filter submodule for filtering the quadrature phase mixed signal 128 to produce the quadrature phase first filtered signal. In addition, the first decimated signal 328 includes an in-phase first decimated signal and a quadrature phase first decimated signal, and wherein the first downsampler 325 includes an in-phase first downsampler submodule for decimating the in-phase first filtered signal to produce the in-phase first decimated signal and a quadrature phase first downsampler submodule for decimating the quadrature phase first filtered signal to produce the quadrature phase first decimated signal.

The basic operation of sample networks 120 will be explained in conjunction with FIGS. 4 and 5 that follow.

Figure 4:
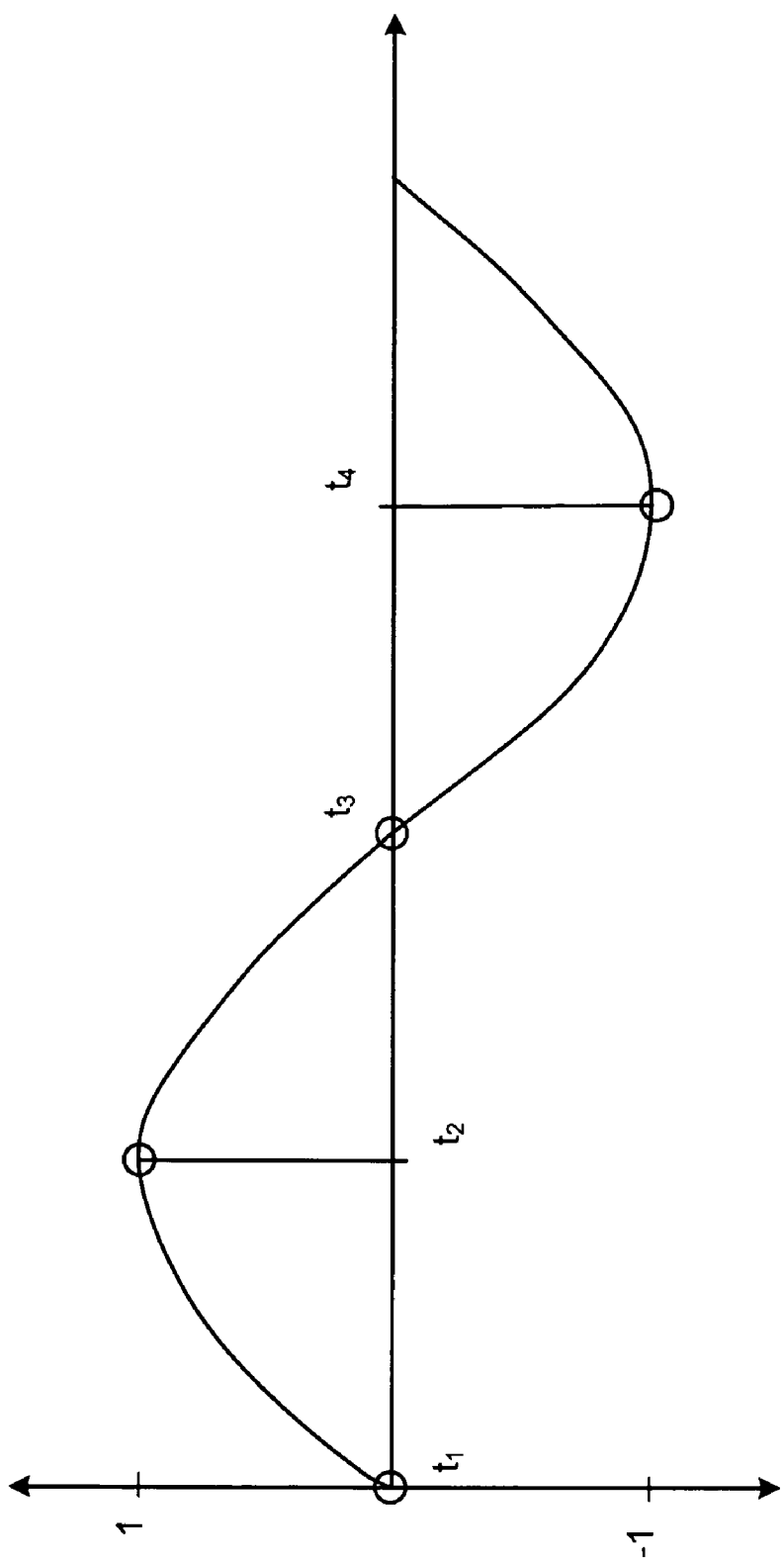
FIG. 4 presents a graphical representation of a sampled sinusoidal wave.

FIG. 4 presents a graphical representation of a sampled sinusoidal wave. In particular a sinusoidal wave is presented that is sampled at 4-times the frequency of the sinusoidal wave, at times $t_1$, $t_2$, $t_3$ and $t_4$. The resulting sample sequence yields corresponding values of 0, 1, 0, −1. Mixing an analog input signal 100 by a sinusoidal signal, and sampling the mixed signal at 4-times the frequency of the sinusoidal signal, can be accomplished by sampling the analog input signal 100 at 4-times the frequency of the desired mixing frequency and by scaling successive samples by a sequence of scale factors, having values:

0, 1, 0, −1, 0, 1, 0 −1, 0, 1, 0 −1 . . .

In accordance with this embodiment, the quadrature phase mixing sequence 122 includes the sequence of scaling factors above.

Figure 5:
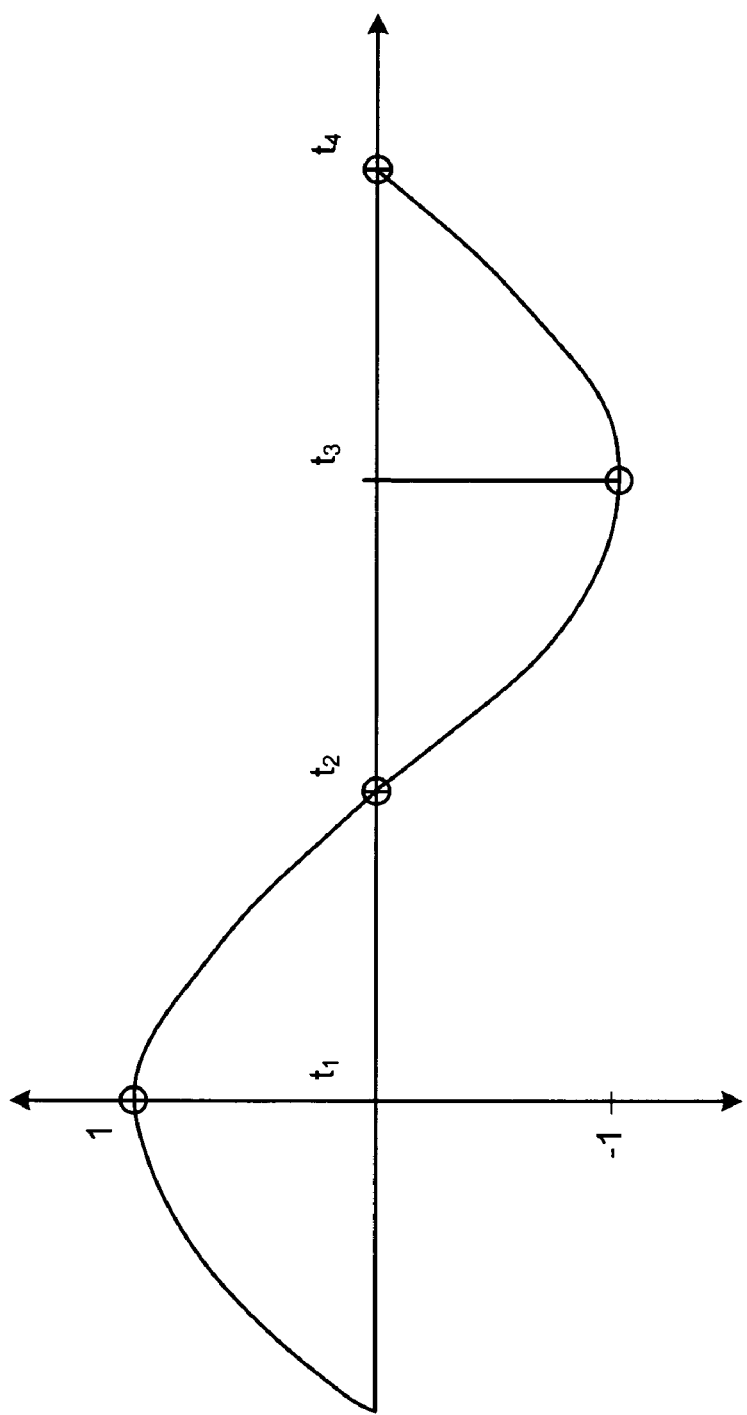
FIG. 5 presents a graphical representation of a sampled cosinusoidal wave.

FIG. 5 presents a graphical representation of a sampled cosinusoidal wave. In particular, a cosinusoidal wave is presented that is sampled at 4-times the frequency of the cosinusoidal wave at times $t_1$, $t_2$, $t_3$, and, $t_4$. The resulting sample sequence yields corresponding values of 1, 0, −1, 0. Mixing an analog input signal 100 by a cosinusoidal signal, and sampling the mixed signal at 4-times the frequency of the cosinusoidal signal, can be accomplished by sampling the analog input signal 100 at 4-times the frequency of the desired mixing frequency and by scaling successive samples by a sequence of scale factors having values:

1, 0, −1, 0, 1, 0 −1, 0, 1, 0 −1, 0 . . .

In accordance with this embodiment, the in-phase phase mixing sequence 124 includes the sequence of scaling factors above.

While the examples presented in FIGS. 4 and 5 present a mixing module that mixes an analog input signal by sinusoidal and cosinusoidal signals, other signals can be used in accordance with the broad scope of the present invention. In a similar fashion as described above, mixing sequences can be generated for other oscillations such as triangle waves, square waves, sawtooth waves, and binary digital signals with varying duty cycles, and other forms of local oscillator signals and similar oscillations.

Figure 6:
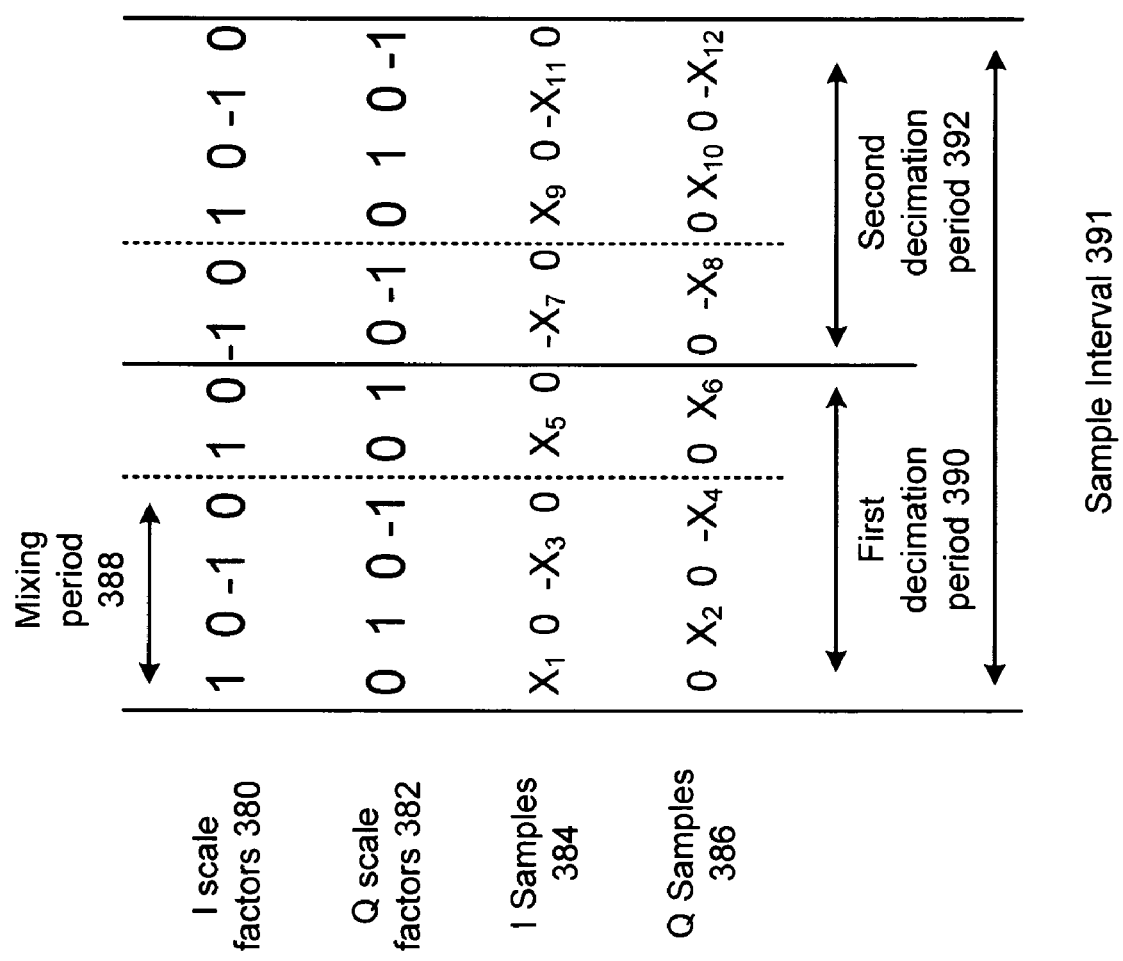
FIG. 6 presents a tabular representation of a sequence of in-phase and quadrature phase scale factors.

FIG. 6 presents a tabular representation of a sequence of in-phase and quadrature phase scale factors. In particular, a sequence of I scale factors 380, such as sequence of I scale factors 122 and a sequence of Q scale factors 382, such as sequence of scale factors 124 is presented. Considering the analog input signal to have values $X_1$, $X_2$, $X_3$, $X_4$, . . . $X_{12}$ at respective times $t_1$, $t_2$, $t_3$, $t_4$, . . . $t_{12}$ over a sample interval 391, the values of mixed signal 322 at discrete times can be represented by the I samples 384 and Q samples 386 shown. Considering the operation of mixing module 320 in light of the operation of the embodiment of the present invention shown in FIG. 1, mixed signal 322 is filtered by first filter 324 and then decimated by first downsampler 325. The first decimated signal 378 has a sample period equal to the decimation period 390. As discussed in conjunction with FIG. 1, the downsampling of the first filtered signal 326 is chosen to have a decimation period 390 that is not a multiple of the mixing period 388. The mixing period is the period in which I or Q scale factors repeat.

Consider a further example where the analog radio signal 316 is a frequency modulated (FM) broadcast signal including a plurality of channels that are spaced 200 kHz apart in the range of 88 MHz to 108 MHz. Consider further a selected channel to be received that operates at a carrier frequency of 100 MHz. Mixing module 320 samples the analog radio signal at a sample frequency of 400 MHz, 4-times higher than the frequency of interest, and the sample period is 2.5 nanoseconds. In this case, the mixing sequence repeats every four samples. Therefore, the mixing period is 4*(2.5 nanoseconds)=10 nanoseconds. Choosing a down sampling factor N=4 would yield a decimation period also equal to 4(2.5 nanoseconds)=10 nanoseconds. In this case, the first decimated signal 328 would have a sampling frequency of 100 MHz. Having the frequency of the first decimated signal 328 equal to the carrier frequency of the selected channel could lead to spurs being introduced into the input of the receiver front end 375. Likewise, choosing a decimation period to be a multiple of the mixing period creates a situation where harmonics of the sample rate of the first decimated signal 328 are equal to the carrier frequency of the selected channel and could also lead to spurs being introduced into the input of the receiver front end 375. As FIG. 6 illustrates, if the decimation period is equal to 1.5 times the mixing period, the harmonics of the decimation frequency (the inverse of the decimation period) do not fall near the carrier frequency of the received signal. The example above can similarly be construed for a case where the sample rate of the mixing module is not exactly four-times the carrier frequency, as in the case of a low IF architecture. Similar benefits as explained in the zero intermediate frequency case apply to this situation as well, while avoiding filtration at, or very near, a frequency of zero.

In accordance with an embodiment of the present invention, these undesirable spurs are eliminated by choosing the decimation period to be a period that is not a multiple of the mixing period. In one embodiment of the present invention, the decimation period is greater than the mixing period. As shown in FIG. 6, the down sampling factor is chosen to be N=6 corresponding to a 6-times down sampling of the first filtered signal 326. In this embodiment, the decimation period 390 is equal to 6*(2.5 nanoseconds)=15 nanoseconds. In this case, the first decimated signal 328 would have a sampling frequency of 66.67 MHz. While the decimation period 390 is greater than the mixing period 388, as shown in the example above, in an alternative embodiment of the present invention, the decimation period can be less than the mixing period.

Figure 7:
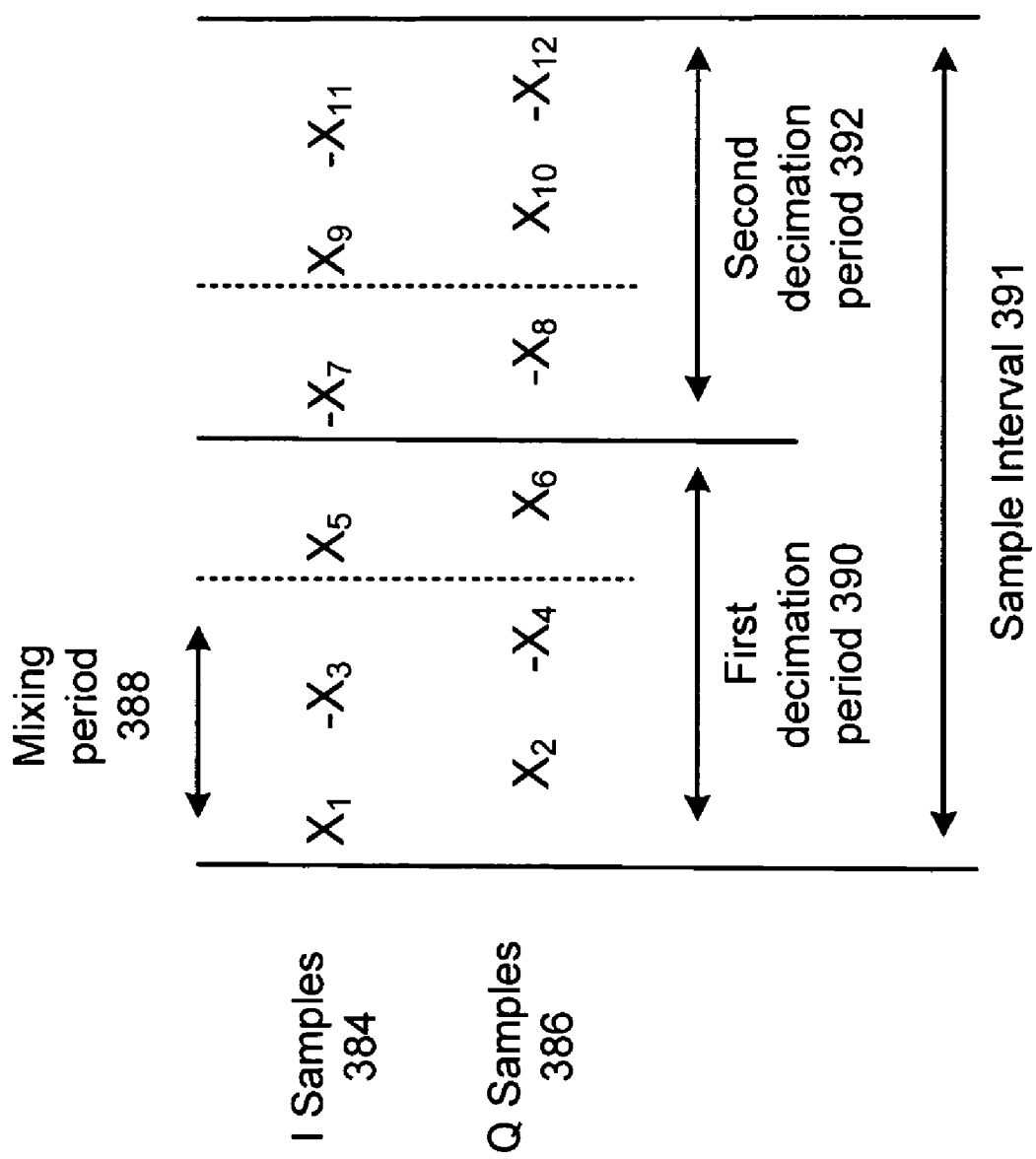
FIG. 7 presents a tabular representation of a sequence of in-phase and quadrature phase samples.

FIG. 7 presents a tabular representation of a sequence of in-phase and quadrature phase samples. Considering the example shown in FIG. 6, each of the even positions of the I samples 384 and each of the odd positions of the Q samples 386 are zero. There is no need to sample a waveform if it will be scaled by a scale factor of zero. Therefore, in an embodiment of the present invention, odd samples of the in-phase sequence and even samples of the quadrature phase sequence are eliminated as shown in FIG. 7.

Considering again the embodiments presented in conjunction with FIGS. 6 and 7, notice that both the I samples 384 and the Q samples 386 of mixed signal 322 in a first decimation period 390 are inverted from the I samples 382 and the Q samples 384 in the second decimation period 392 in the sample interval 391. An alternate embodiment could be constructed where the mixer block 320 from FIG. 1 is implemented such that the scale factors shown in FIG. 6 and 7 are the same in the first decimation period 390 as compared to the second decimation period 392. Then an additional phase inversion block could be added that implements the phase inversion of the samples between the first and second decimation periods. This embodiment is shown in FIG. 8.

Figure 8:
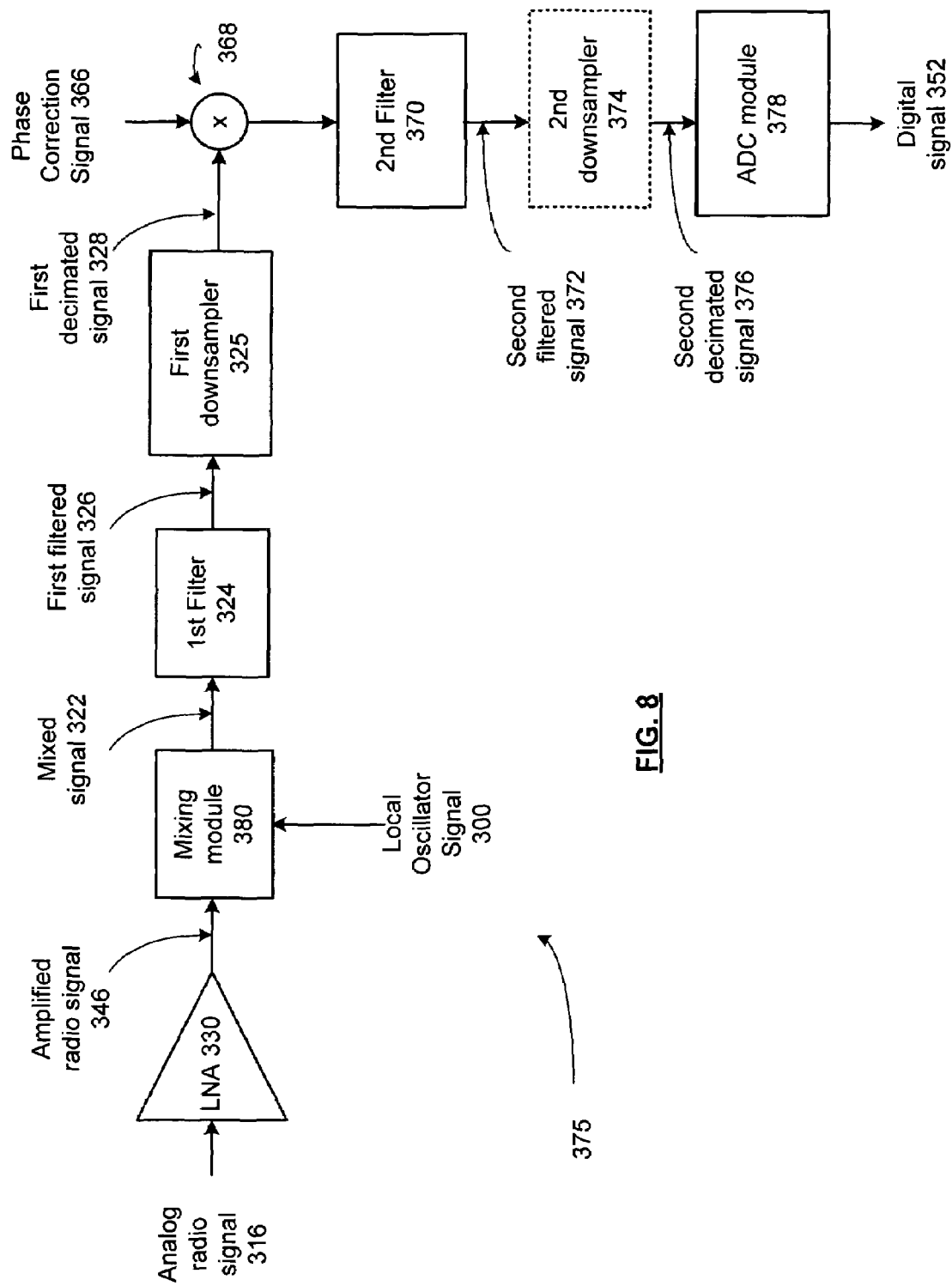
FIG. 8 presents a block diagram representation of a radio receiver front end in accordance with an embodiment of the present invention.

FIG. 8 presents a block diagram representation of a radio receiver front end in accordance with an embodiment of the present invention. In this embodiment of the present invention, the radio receiver front end 375 uses an alternate mixing module 380, and further includes a mixer 368 for mixing the first decimated signal 328 by a phase correction signal 366 to correct the phase of first decimated signal 328. In this embodiment of mixing module 380, the I scale factors are 1, −1, 1, −1, −1 . . . and the Q scale factors are 1, −1, 1, 1, −1, 1 . . . both shown with zeros omitted in similar fashion as that done in FIG. 7. The mixer 368 then multiplies the first decimated signal 328 by alternating 1 and −1's. In this fashion, the signal processing performed by mixer 368 and mixing module 380 in FIG. 8 can be equated to the signal processing performed by mixing module 320 in FIG. 1.

Figure 9:
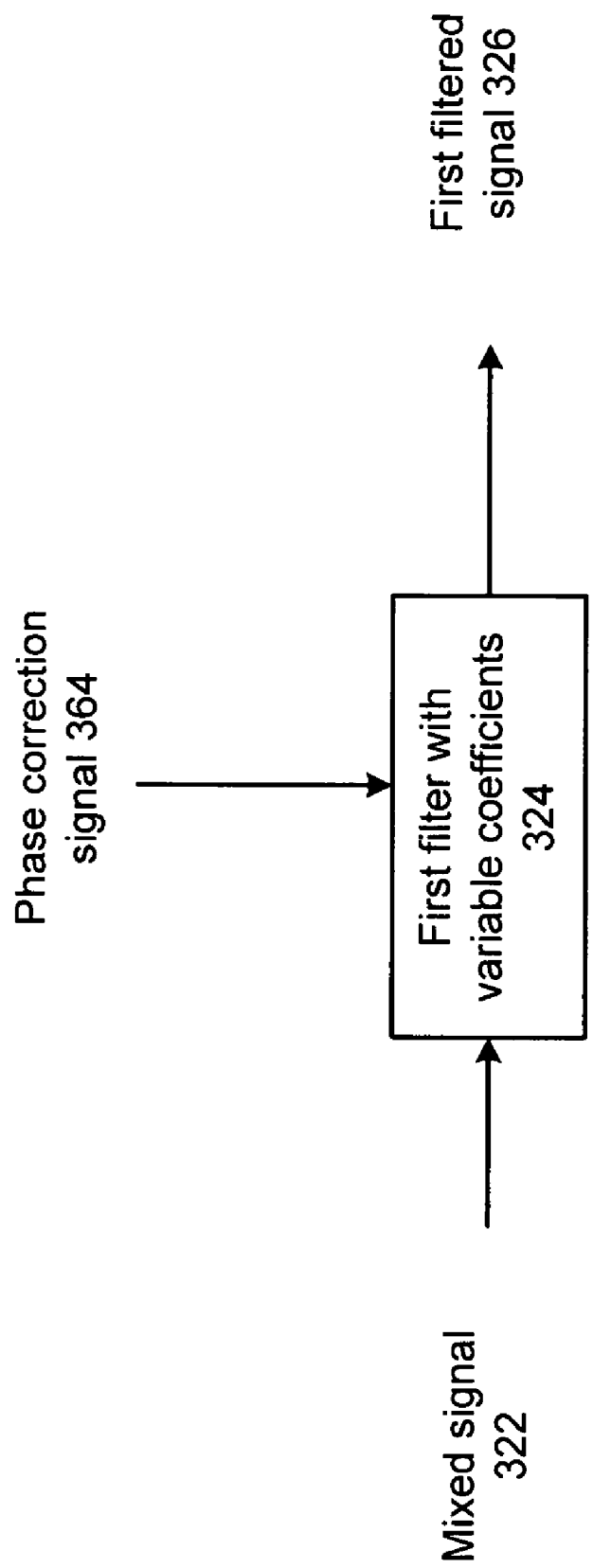
FIG. 9 presents a block diagram representation of a first filter in accordance with an alternative embodiment of the present invention.

FIG. 9 presents a block diagram representation of a first filter in accordance with an alternative embodiment of the present invention. In this embodiment of the present invention, the first filter 324 includes variable coefficients that vary in time in accordance with a phase correction signal 364. In particular, for each value of mixed signal 322 in a sequence, the coefficients of first filter 324 are scaled by each value of a sequence of phase correction values. In accordance with the embodiment presented in conjunction with FIG. 6, the coefficients of first filter 324 are each multiplied by a phase correction signal 364 that includes a sequence of values:

1, 1, 1, 1, 1, 1, −1, −1, −1, −1, −1, −1, 1, 1, 1, 1, 1, 1 . . .

In this case, the polarity of each of the coefficients of first filter 324 is inverted after every interval of six values of mixed signal 322.

In accordance with FIG. 7, the coefficients of first filter 324 are each multiplied by a phase correction signal 364 that includes a sequence of values:

1, 1, 1, −1, −1, −1, 1, 1, 1 . . .

In this case, the polarity of each of the coefficients of first filter 324 is inverted after every interval of three values of mixed signal 322. In this embodiment the mixer module that produces the mixed signal 322 is similar to the mixing module 320 from FIG. 1, and the first filter 324 from FIG. 9 additionally implements the functionality of mixer 368 shown in FIG. 8.

Figure 10:
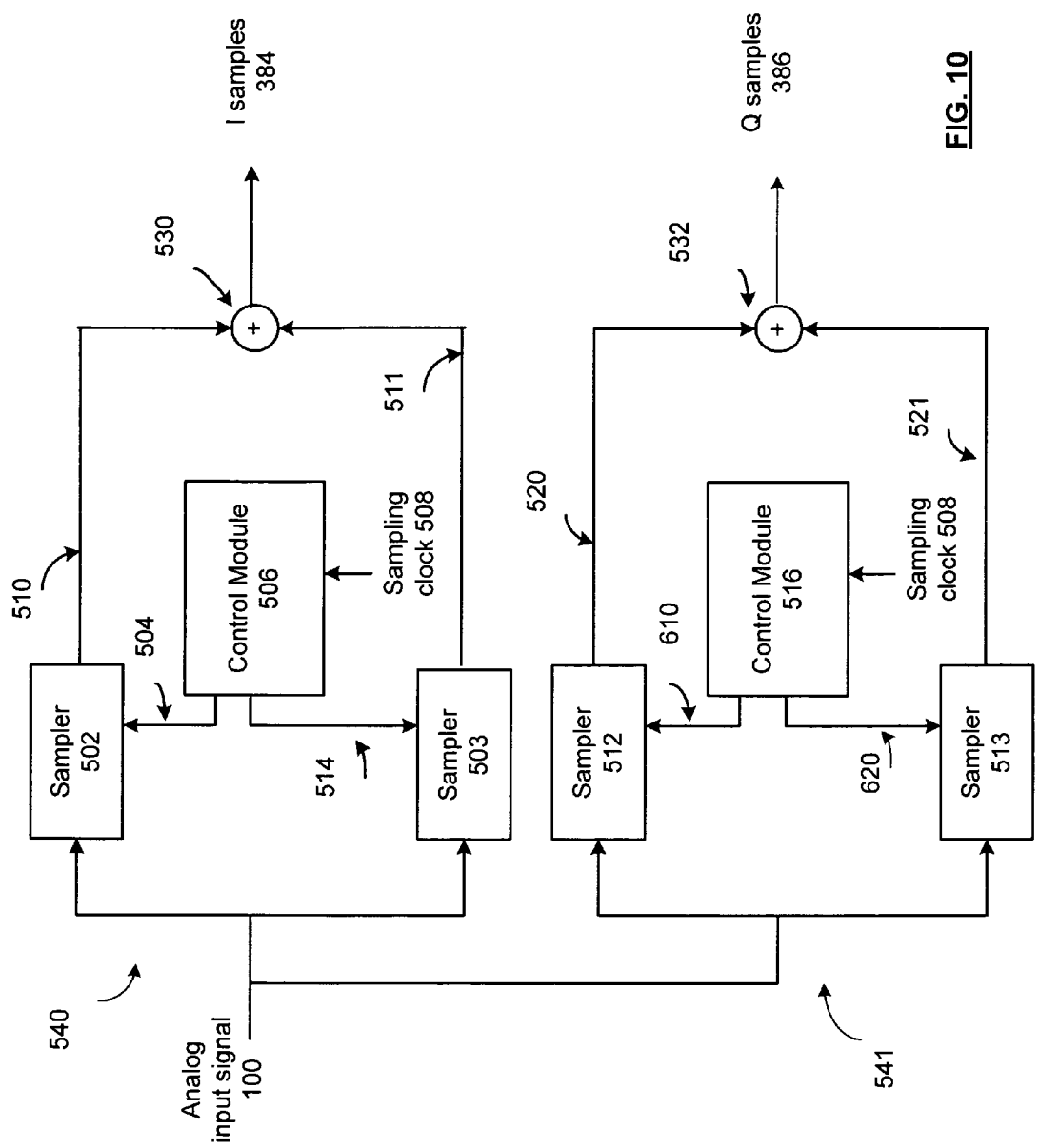
FIG. 10 presents a block diagram representation of a sample network in accordance with an embodiment of the present invention.

FIG. 10 presents a block diagram representation of in-phase and quadrature-phase sample networks in accordance with an embodiment of the present invention. Sample network 540 includes a sampler 502 for generating a plurality of samples 510 of the analog input signal 100 in response to control signals 504 and sampler 503 for generating a plurality of samples 511 of the analog input signal 100 in response to control signals 514. The sample network 540 further includes a first control module 506, operably coupled to a sampling clock 508. In an embodiment of the present invention, the control signals 504 and 514 include a sequence of sample positions and a sequence of scale factors based on the mixing sequence. Adder 530 superimposes the samples 510 and samples 511 to form the sequence of in-phase samples 384.

In an embodiment of the present invention, the sample network 541 includes a sampler 512 for generating a corresponding plurality of samples 520 of the analog input signal 100 in response to control signal 610 and sampler 513 for generating a plurality of samples 521 of the analog input signal 100 in response to control signal 620. The sample network 541 further includes a control module 516, operably coupled to a sampling clock 508. In an embodiment of the present invention, the control signals 610 and 620 include a sequence of sample positions and a sequence of scale factors based on the mixing sequence. Adder 532 superimposes the samples 520 and 521 to form the sequence of quadrature phase samples 386.

In an embodiment of the present invention, the samplers 502, 503, 512 and 513 each include a plurality of switched sample modules, such as switched capacitor circuits or other devices for generating a corresponding plurality of samples. Consider the operation of the sample network 540 in light of the example presented in conjunction with FIG. 7. In an embodiment of the present invention, the sampler 502 includes three switched sample modules for generating three samples 510 during a first decimation period, $X_1, X_3, X_5$. The sampler 503 includes three switched sample modules for generating three samples 511 during a second decimation period, $X_7, X_9, X_{11}$. In accordance with this embodiment of the present invention, the sequence of sample positions is:

$S_1, S_3, S_5, S_7, S_9, S_{11}, S_1, S_3, S_5, S_7, S_9, S_{11}, \ldots$

Where the sample module $S_i$, generates the sample $X_i$, where $S_1, S_3, S_5$ represent the three switched sample modules of sampler 502 and $S_7, S_9, S_{11}$, represent the three switched sample modules of sampler 503 and the positions of switched sample modules $S_1, S_3, S_5, S_7, S_9, S_{11}$, in the sequence represent the order in which the switch sample modules are commanded to sample by control signals 504 and 514. In accordance with this embodiment of the present invention, the corresponding scale factors are:

1, −1, 1, −1, 1, −1, 1, −1, 1, −1, 1, −1, . . .

In an embodiment of the present invention, control modules 506 and/or 516 are implemented using a processor, such as a digital signal processor (DSP), digital state machine or other digital processing circuit. The sequence of sampled positions is a predetermined sequence that is generated by either calculating the positions based on an algorithm that is implemented by the DSP or by retrieving the sequence of sample positions from memory or by a digital state machine. In a similar fashion, the sequence of scale factors is a predetermined sequence that is generated by either calculating the scale factors based on an algorithm that is implemented by the DSP or by retrieving the scale factors from memory or by a digital state machine. The control signals 504 and 514 are formed, based on the sampling clock 508 and the sequence of sample positions, so as to command each of the switched sample modules 502 to sample the analog input signal 100 at the predetermined time and order in the sample sequence. In addition, control signals 504 and 514 are formed based on the sequence of scale factors to apply the appropriate scale factor to each switched sample module 502 and each corresponding sample of analog input signal 100.

In an embodiment of the present invention, each switched sample module of samplers 502, 503, 512 and 513 includes a mixer for multiplying each sample of the analog input signal 100 by its corresponding scale factor. In an alternative embodiment of the present invention, the phase of each sample of analog signal 100 is selectively inverted when the corresponding scale factor is equal to −1 and is left uninverted when the corresponding scale factor is equal to 1. However, other algorithms and circuits are similarly possible for applying the sequence of scale factors to the samples as will be apparent to one of ordinary skill in the art when presented with the disclosure herein.

In accordance with an embodiment of the present invention, each of the switched sample modules can be implemented with a switched capacitor circuit. The use of two samplers 502 and 503, and two corresponding sets of switched sample modules, allows the switched sample modules of sampler 502 to be sampled during the first decimation period and dumped during the second decimation period. Similarly, the switched sample modules of sampler 503 can be sampled during the second decimation period and dumped during the third decimation period, etc. In this way, circuits 502 and 503 time share the function of sampling and dumping. In an embodiment of the present invention, the control signals 504 include a command for each of the switched sample modules 502 to dump the sample of analog input signal 100 at the appropriate time. Similarly, the control signals 514 include a command for each of the switched sample modules 503 to dump the sample of analog input signal 100 at the appropriate time.

Figure 11:
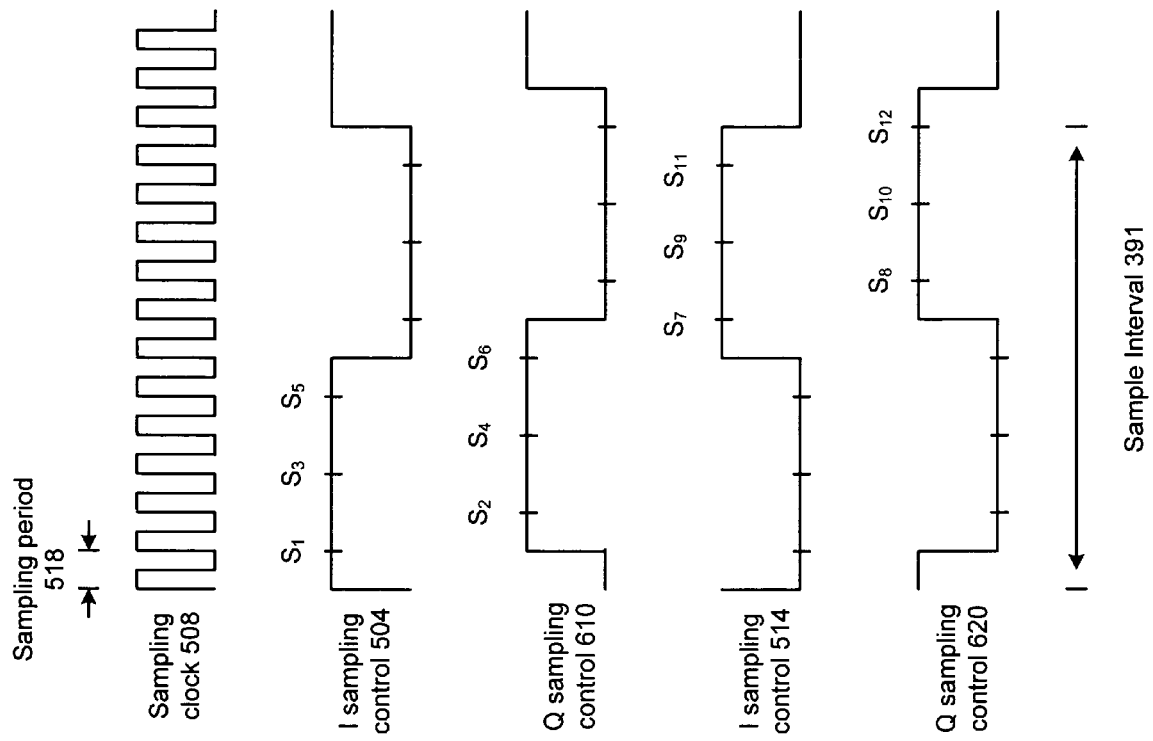
FIG. 11 presents a graphical representation of a plurality of sampling control signals in accordance with an embodiment of the present invention.

FIG. 11 presents a graphical representation of a plurality of sampling control signals in accordance with an embodiment of the present invention. In particular, two sample networks are implemented: a first sample network 540 being implemented to generate a sequence of I samples from analog input signal 100, and a second sample network 541 being implemented to generate a sequence of Q samples from analog input signal 100 as previously discussed. In light of the example discussed above, the second sample network 541 includes two samplers 512 and 513 that each include three switched sample modules, $S_2, S_4, S_6, S_8, S_{10}, S_{12}$.

Clock signal 508, having a sampling period 518, is presented along with an I sampling control 504, a Q sampling control 610, an I sampling control 514 and a Q sampling control 620. When each control signal is high, the corresponding control module commands the switched sample modules to sample at the times $S_i$, as shown. When each clock signal is low, the corresponding control module commands the switched sample modules to dump their sampled values. In terms of the order of sampling of analog input signal 100, the sequence of samples, considering both the I and Q sample sequences, can be represented as:

In-Phase Sample Sequence
$S_1, S_3, S_5, S_7, S_9, S_{11}, S_1, S_3, S_5, S_7, S_9, S_{11} \ldots$
Quadrature Phase Sample Sequence
$S_2, S_4, S_6, S_8, S_{10}, S_{12}, S_2, S_4, S_6, S_8, S_{10}, S_{12}, \ldots$ The corresponding sequence of scale factors would be:
In-Phase Scale Factors
1, −1, 1, −1, 1, −1, 1, −1, 1, −1, 1, −1, . . .
Quadrature Phase Scale Factors
1, −1, 1, −1, 1, −1, 1, −1, 1, −1, 1, −1, . . .

In accordance with this embodiment of the present invention, the sequence of sample positions above together with the corresponding scale factors make up the mixing sequence. In should be noted that the sequence of sample positions repeats over a sample position period, that is equal to 12 times the sample period. In other words in this embodiment, the sample position period is equal to a sample interval, wherein the sample interval is equal to the sample period times the number of the plurality of switched sample circuits for both the in-phase and quadrature phase sampling networks.

Figure 12:
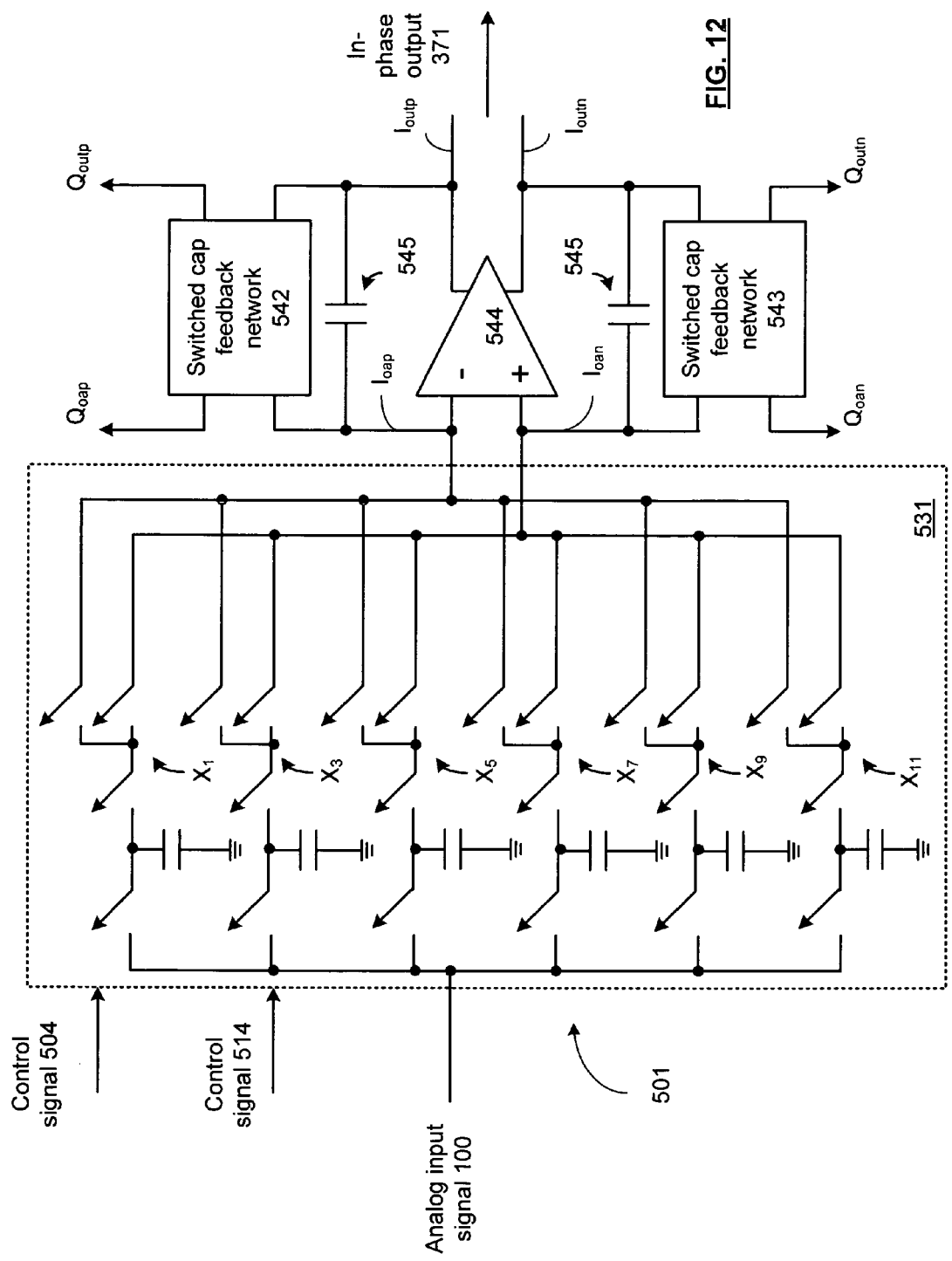
FIGS. 12 and 13 present a schematic/block diagram representations of switched capacitor circuits in accordance with an embodiment of the present invention.
Figure 13:
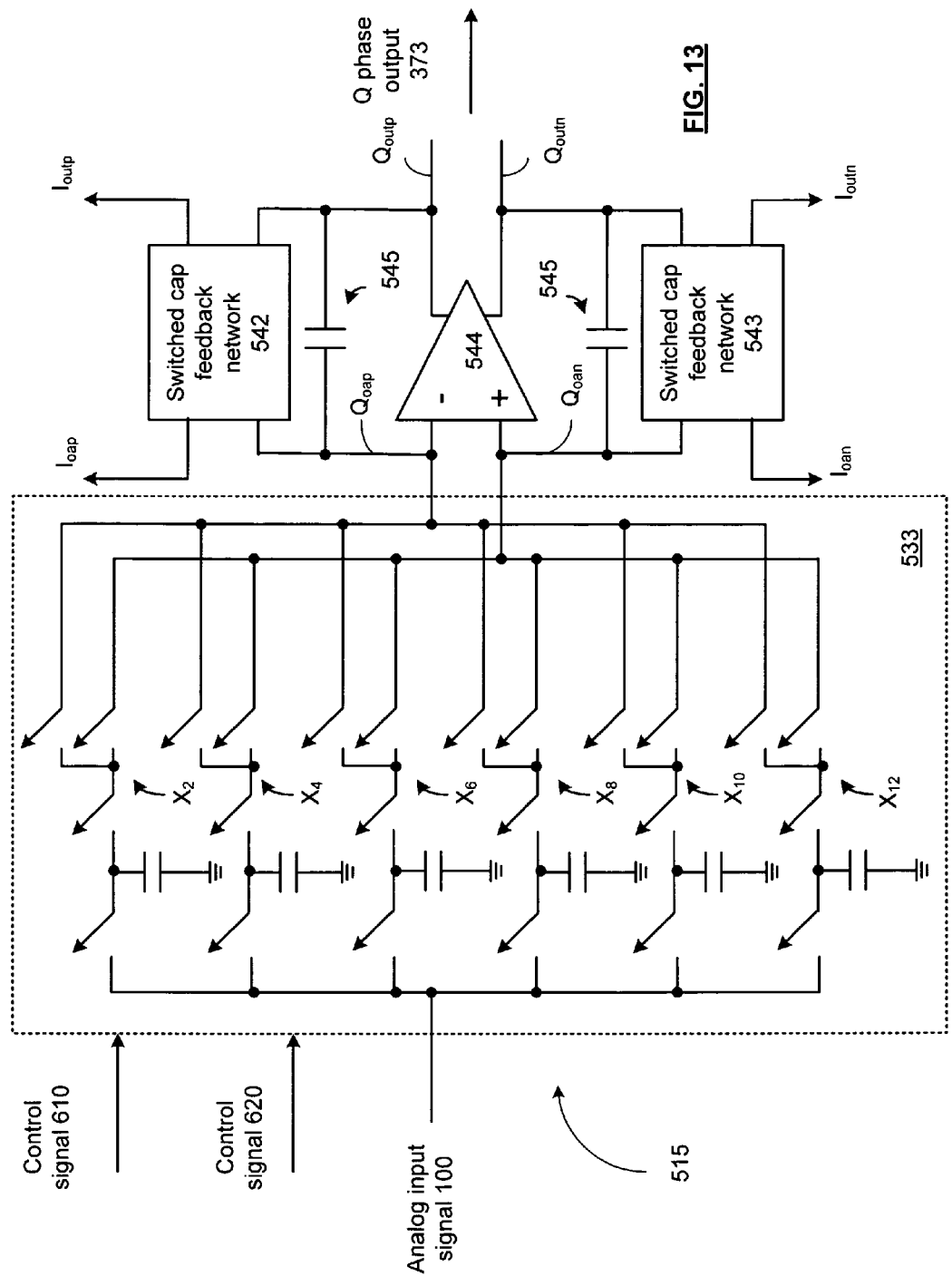

FIGS. 12 and 13 present a schematic/block diagram representations of switched capacitor circuits in accordance with an embodiment of the present invention. In particular, FIG. 12 presents a circuit 501 for generating an in-phase output 371 and FIG. 13 presents a circuit 515 for generating a quadrature phase output 373. Circuit 501 includes a switched capacitor circuit 531 for providing the functionality of samplers 502 and 503 and of sample network 540 in response to control signals 504 and 514. Samples ($X_1$, $X_3$, $X_5$, $X_7$, $X_9$, $X_{11}$), are generated by sampling analog input signal 100. By dumping these samples $X_i$, to the inverting or non-inverting input of operational amplifier 544, the polarity of the sample can be inverted as selectively required to generate the in-phase component of mixed signal 322. Circuit 515 includes switched capacitor circuit 533 for providing the functionality of samplers 512 and 513 and of sample network 541 in response to control signals 610 and 620. Samples ($X_2$, $X_4$, $X_6$, $X_8$, $X_{10}$, $X_{12}$), are generated by sampling analog input signal 100. By dumping these samples $X_i$, to the inverting or non-inverting input of operational amplifier 544, the polarity of the sample can be inverted as selectively required to generate the quadrature phase component of mixed signal 322. In other embodiments, the desired polarity of the samples may be known a priori so that both connections from the capacitors in switched sample circuits 531 and 533 are not needed and therefore could be reduced to a single connection. In this reduced complexity embodiment, some of the switches shown in FIGS. 12 and 13 could be eliminated.

Operational amplifiers 544, in conjunction with capacitors 545, the switched capacitor circuits 531 and 533, and switched capacitor feedback networks 542 and 543 (that are shared by circuits 501 and 515 in a manner that will be discussed in greater detail below) each implement a switched capacitor filter. In an embodiment of the present invention, the switched capacitor filter is a leaky bucket integrator that can be described in terms of its transfer function in the Z transform domain as:

$$H(z)=1/(1-(1-\alpha)Z^{-1})$$

This leaky bucket integrator is, in effect, a low-pass filter with very high low-frequency gain and a very low cut-off frequency. This leaky bucket integrator implements second filter 370. In alternative embodiments of the present invention, other IIR filters including other low pass filters or integrators of first order or of order greater than one, can be implemented in accordance with the broad scope of the present invention.

In operation, the switched capacitor circuits 531 and 533 are commanded by control signals 504, 514, 610 and 620 to sample in the sequences discussed in conjunction with FIGS. 6-11. Alternating halves of the switched capacitors of switched capacitor circuits 531 and 533 are alternatively coupled to analog input signal 100 during a sampling period and to integrator circuit 544 during a dump period. As detailed in FIG. 11, samples $X_1$, $X_3$ and $X_5$ operate at alternating times from samples $X_7$, $X_8$ and $X_{11}$ in switched capacitor network 531. Similarly, samples $X_2$, $X_4$ and $X_6$ operate at alternating times in from samples $X_8$, $X_{10}$ and $X_{12}$ in switched capacitor network 533. In this fashion, the charges from the switched capacitor modules are accumulated into a single value that is dumped to the operational amplifier 544, effectively providing sampling, mixing, first filtration, downsampling and second filtration operations in a single circuit configuration. In an embodiment of the present invention, the circuits 501 and 515 provides the functionality of mixing module 320, first filter 324 first downsampler 325 and second filter 370. In-phase output 371 and quadrature phase output 373 comprise second filtered signal 372. While one particular switched capacitor sampling scheme is shown in FIGS. 12 and 13, other circuit designs that include correlated double sampling or stray insensitive clocking can likewise be implemented, as will be apparent to one skilled in the art when presented with the disclosure herein.

It should be recognized, however, that variations in switched capacitor circuits 531 and 533 used in the implementation of a mixing module, such as mixing module 320, can yield circuit imbalances that can introduce noise into a circuit. Considering the example discussed in conjunction with FIGS. 11-13 above, a variation between the switched capacitor circuit that implements switched sample module $S_1$ and the switched capacitor circuit that implements switched sample module $S_2$ causes an imbalance between the resulting I and Q samples. This imbalance can be compensated by assigning a first order to the sequence of sample positions during a first sample interval, and a second order to the sequence of sample positions during a second sample interval, wherein the length of first sample interval and the length of the second sample interval is equal to the sequence period, and wherein the first order is different from the second order. In particular, at least one of the plurality of switched sample modules generates an in-phase sample during the first sample interval and a quadrature phase sample during the second sample interval.

In accordance with an embodiment of the present invention, the sequence of sample positions are altered to have the switched sample module $S_1$ corresponding to the first I sample during a first sample interval and a first Q sample during a second interval in Example 1 as follows:

In-Phase Sample Sequence
$\underline{S_1}$, $S_3$, $S_5$, $S_7$, $S_9$, $S_{11}$, $\underline{S_2}$, $S_3$, $S_5$, $S_7$, $S_9$, $S_{11}$, . . .
Quadrature Phase Sample Sequence
$\underline{S_2}$, $S_4$, $S_6$, $S_8$, $S_{10}$, $S_{12}$, $\underline{S_1}$, $S_4$, $S_6$, $S_8$, $S_{10}$, $S_{12}$, . . .

In this fashion, the sequence of sample positions repeats at a sample position period that is 24 samples long, while the sample interval is only 12 samples. Therefore, the sequence of sample positions repeats at a sample position period that is greater than the sample interval. Applying this swap for each of the switched sample modules results in the following sequence of sample positions, in Example 2:

In-Phase Sample Sequence
$S_1$, $S_3$, $S_5$, $S_7$, $S_9$, $S_{11}$, $S_2$, $S_4$, $S_6$, $S_8$, $S_{10}$, $S_{12}$, . . .
Quadrature Phase Sample Sequence
$S_2$, $S_4$, $S_6$, $S_8$, $S_{10}$, $S_{12}$, $S_1$, $S_3$, $S_5$, $S_7$, $S_9$, $S_{11}$, . . .

It should also be recognized that a variation, say, between the switched capacitor circuit that implements switched sample module SI and the switched capacitor circuit that implements switched sample module $S_3$ can have an adverse effect on the frequency response of first filter 324. In particular, the amount of out of band attenuation of this anti-aliasing filter is less if there is an imbalance between the different samples. The filter performance can likewise be improved by assigning a first order to the sequence of sample positions during a first sample interval, and a second order to the sequence of sample positions during a second sample interval, wherein the length of first sample interval is equal to the length of the second sample interval, and wherein the first order is different from the second order.

In accordance with an embodiment of the present invention, changing the sequence of sample positions to have the switched sample module $S_1$ corresponding to the first I sample during a first sample interval and the second I sample during a second interval yields Example 3 as follows:

In-Phase Sample Sequence
$\underline{S_1}$,$S_3$, $S_5$, $S_7$, $S_9$, $S_{11}$, $\underline{S_3}$,$\underline{S_1}$, $S_5$, $S_7$, $S_9$, $S_{11}$, . . .
Quadrature Phase Sample Sequence
$\underline{S_2}$,$S_4$, $S_6$, $S_8$, $S_{10}$, $S_{12}$, $\underline{S_4}$,$\underline{S_2}$, $S_6$, $S_8$, $S_{10}$, $S_{12}$, . . .

In this fashion, the sequence of sample positions repeats at a sample position period that is 24 samples long and while the sample interval is only 12 samples. Therefore, the sequence of sample positions repeats at a sample position period that is greater than the sample interval. Applying one possible permutation for the switched sample modules results in the following sequence of sample positions, Example 4:

In-Phase Sample Sequence
$S_1, S_3, S_5, S_7, S_9, S_{11}, S_3, S_1, S_7, S_5, S_{11}, S_9, \ldots$
Quadrature Phase Sample Sequence
$S_2, S_4, S_6, S_8, S_{10}, S_{12}, S_4, S_2, S_8, S_6, S_{12}, S_{10}, \ldots$ One of ordinary skill in the art will recognize, based on the teachings presented herein, that further benefits will result by combining the exchange of successive samples of Example 4, with the exchange between I and Q samples of Example 2. Further, other more complex schema for alternating between a greater number of samples or generating greater sample position periods are likewise possible within the broad scope of the present invention.

Figure 14:
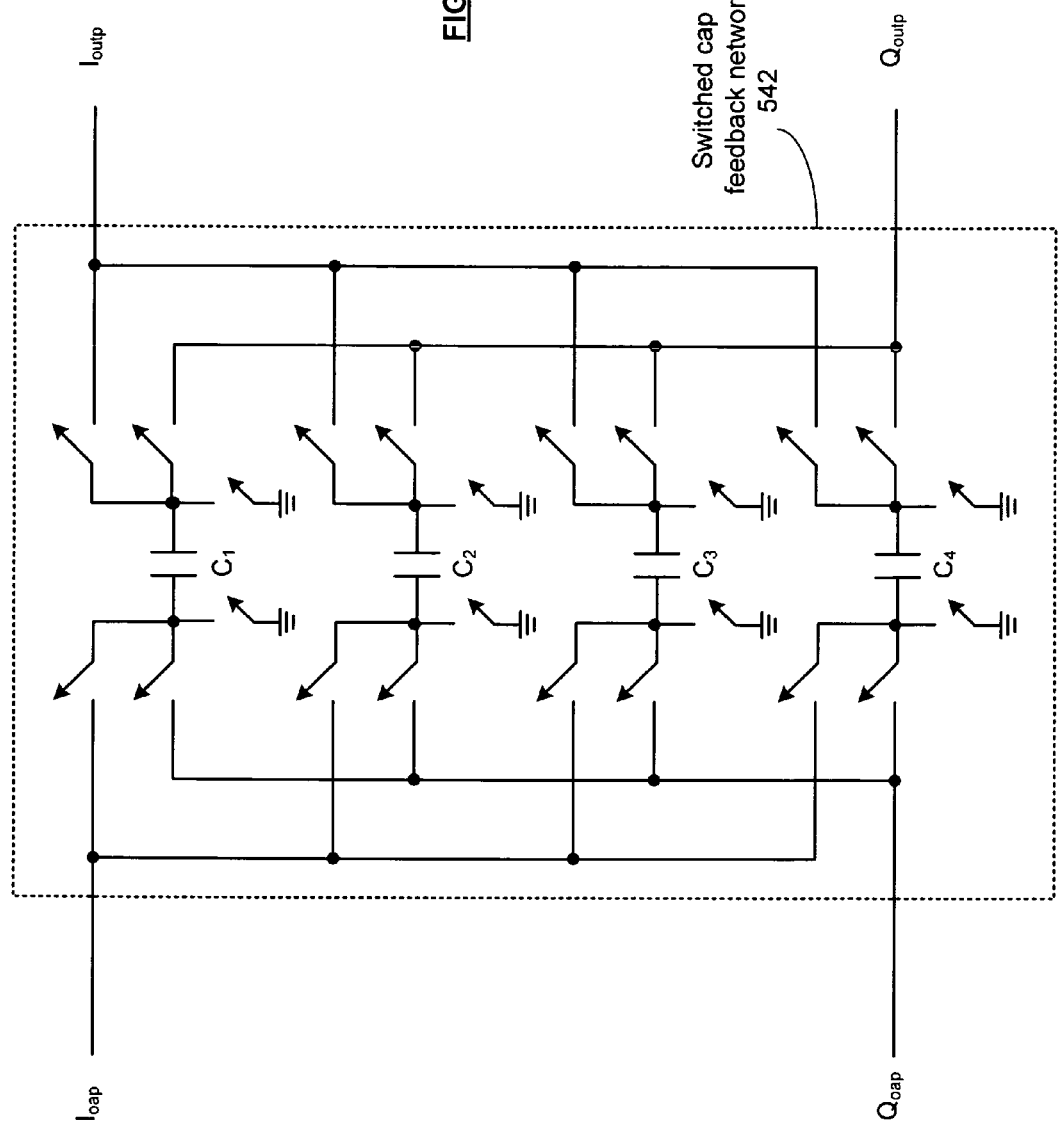
FIGS. 14 and 15 present a schematic representation of switched capacitor feedback networks in accordance with an embodiment of the present invention.
Figure 15:
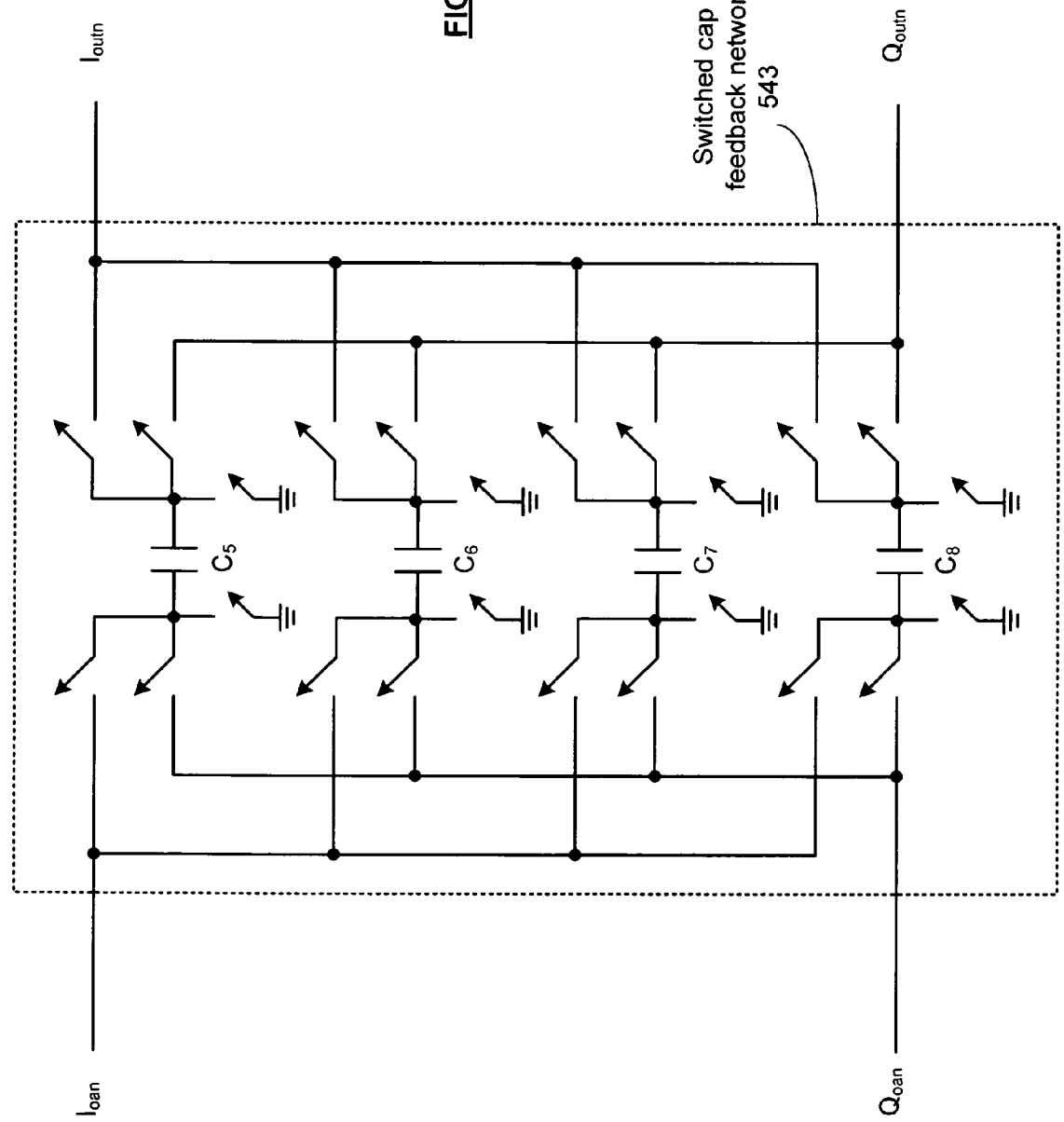

FIGS. 14 and 15 presents a schematic representation of switched capacitor feedback networks in accordance with an embodiment of the present invention. It can be recognized that variations in the components of switched capacitor feedback networks 542 and 543 used in conjunction with the feedback to the inverting and non-inverting inputs of operation amplifiers 544 used in conjunction circuits 501 and 515 can yield gain imbalances between the in-phase and quadrature phase submodules of second filter 370. In an embodiment of switched capacitor feedback network 542, four switched capacitors $C_1$, $C_2$, $C_3$, and $C_4$ are switched to alternatively implement a switched capacitor resistor for the positive component of the I samples and the Q samples of analog signal 100. Similarly, switched capacitor feedback network 543 includes four switched capacitors $C_5$, $C_6$, $C_7$, and $C_8$ are switched to alternatively implement a switched capacitor resistor for the negative differential component of the I samples and the Q samples of analog signal 100. In this fashion, the capacitors $C_1$, $C_2$, $C_3$, $C_4$ $C_5$, $C_6$, $C_7$, and $C_8$ are time shared between circuits 501 and 515 in order to compensate for possible circuit imbalances.

The tables below demonstrates one possible switching sequence that can be implemented by switched capacitor feedback networks 542 and 543. The time index moves forward $t_a$, $t_b$, $t_c$ and $t_d$ representing consecutive, substantially uniform spacings in time. The table below also demonstrates how each capacitor is time shared between processing the I signal and the Q signal in an alternating fashion.

| Time | $C_1$ | $C_2$ | $C_3$ | $C_4$ |
|---|---|---|---|---|
| $t_a$ | Sample I | Sample Q | Dump Q | Dump I |
| $t_b$ | Dump I | Dump Q | Sample I | Sample Q |
| $t_c$ | Sample Q | Sample I | Dump I | Dump Q |
| $t_d$ | Dump Q | Dump I | Sample Q | Sample I |

| Time | $C_5$ | $C_6$ | $C_7$ | $C_8$ |
|---|---|---|---|---|
| $t_e$ | Sample I | Sample Q | Dump Q | Dump I |
| $t_f$ | Dump I | Dump Q | Sample I | Sample Q |
| $t_g$ | Sample Q | Sample I | Dump I | Dump Q |
| $t_h$ | Dump Q | Dump I | Sample Q | Sample I |

In particular, each table describes the function performed by the associated capacitor and switched capacitor circuit is described during successive times in a sampling sequence. However, other possible sequences, both more and less complex, are likewise possible as will be apparent to one skilled in the art when presented with the disclosure herein.

Figure 16:
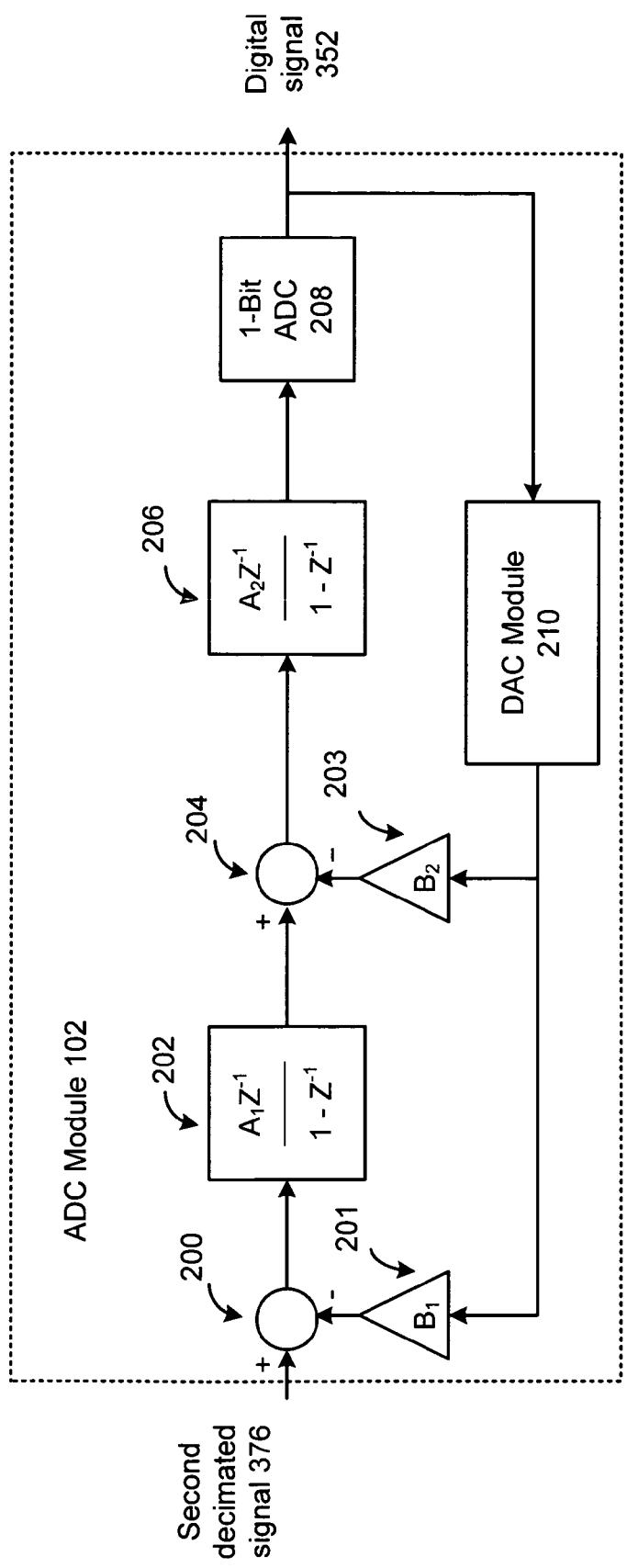
FIG. 16 presents a combination block diagram and schematic diagram of an ADC module in accordance with an embodiment of the present invention.

FIG. 16 presents a combination block diagram and schematic diagram of an ADC module in accordance with an embodiment of the present invention. In particular, ADC module 378 is implemented using a delta sigma modulator. Second decimated signal 376 is fed to the noninverting input of a first adder 200. First adder generates an output signal that is the difference between second decimated signal 376 and a reconstructed analog version of digital signal 352 produced by digital to analog converter (DAC) module 210 and gain stage 201. The output of the first adder is integrated by first integrator 202 to produce a first integrated output that is provided to the non-inverting input of a second adder 204. Second adder 204 produces an output that is the difference between the first integrated output and a reconstructed analog version of digital signal baseband signal 352 produced by DAC module 210 and gain stage 203. The output of second adder 204 is integrated by a second integrator 206 and digital signal 352 is produced by converting the output of the second adder to a digital signal using a 1-bit ADC module 208.

In operation, the delta sigma converter operates at a relatively high variable clock frequency in order to over-sample the input signal, second decimated signal 376. This oversampling spreads the quantization noise produced by the ADC module 378 over a frequency range that is wider than the signal bandwidth. The result is a high precision voltage measurement for accurate processing of second decimated signal 376. While ADC module 378 has been described in terms of a delta sigma modulator, other ADC configurations including delta modulators, flash converters and other analog to digital converter methods, with or without significant oversampling, could likewise be used in alternative embodiments of the present invention. Also, alternative delta sigma architectures could be used such as multi-stage noise shaping (MASH), multi-bit quantizers, and higher or lower order loops.

Figure 17:
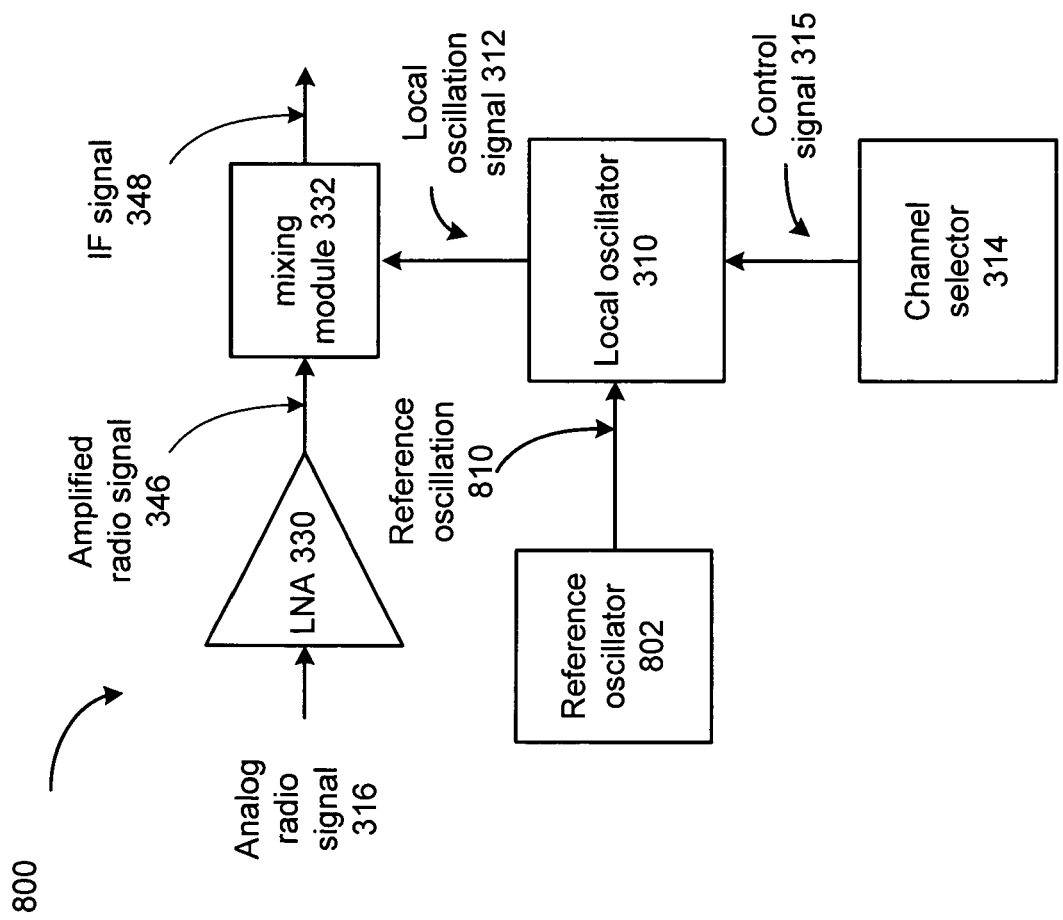
FIG. 17 presents a block diagram representation of a radio frequency front end in accordance with an embodiment of the present invention.

FIG. 17 presents a block diagram representation of a radio frequency front end in accordance with an embodiment of the present invention. Radio receiver front end 800, optionally used in conjunction with radio receiver front end 375 of FIG. 8, receives a received radio signal 316 having a plurality of channel signals, each of the plurality of channel signals being modulated at one of a corresponding plurality of carrier frequencies. Reference oscillator 802 produces a reference oscillation 810 that is transformed by local oscillator 310 into a local oscillation signal 312 at a local oscillation frequency. A channel selector 314 produces control signal 315 that selects the local oscillation frequency for local oscillator 310 corresponding to a selection of one of the plurality of channels. In an embodiment of the present invention, local oscillator 310 includes a phase locked loop circuit for producing a selected local oscillation frequency based on the selected one of the plurality of channels.

Low noise amplifier 330 produces a amplified radio signal 346 that is mixed with the local oscillation signal 312 by mixing module 332 to form IF signal 348 at an intermediate frequency. In a preferred embodiment of the present invention, the gain at which the low noise amplifier 330 amplifies the receive signal 316 is dependent on the magnitude of the received radio signal 316 and an automatic gain control circuit. Note that IF signal 348 is a modulated signal and if the local oscillation signal 312 has a frequency that matches the frequency of the selected channel, the IF signal 348 will have a carrier frequency of approximately zero. If the local oscillation 312 has a frequency that is not equal to the carrier frequency of radio signal 346, then the IF signal 348 will have a carrier frequency equal to the difference between the carrier frequency of the selected channel and the frequency of local oscillation 312. In such a situation, the carrier frequency of the IF signal 348 may range from 0 hertz to one megahertz or more.

Figure 18:
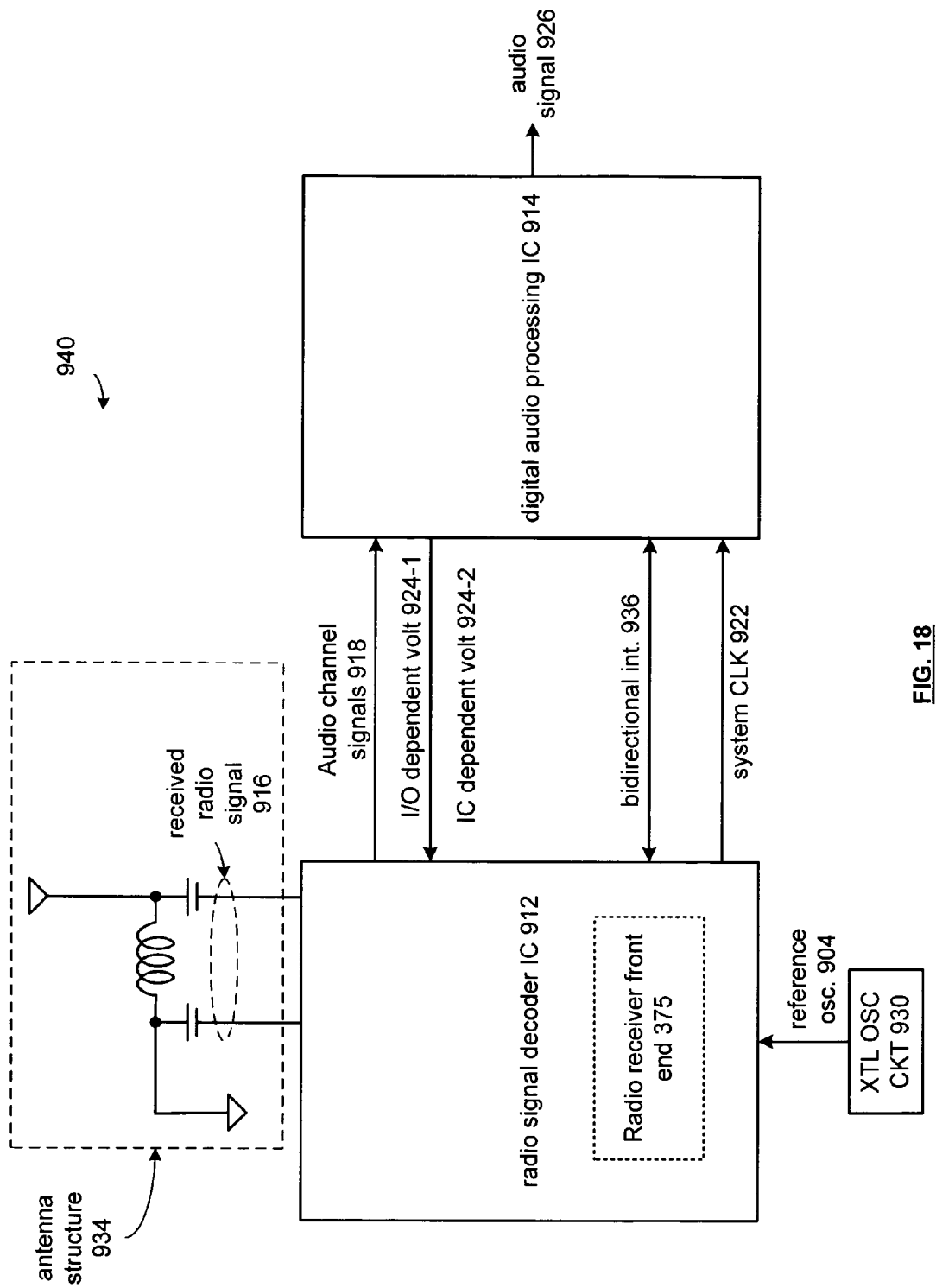
FIG. 18 presents a schematic block diagram of a handheld audio system in accordance with an embodiment of the present invention.

FIG. 18 presents a schematic block diagram of a handheld audio system in accordance with an embodiment of the present invention. In particular, handheld audio system 940 is presented that includes a radio signal decoder integrated circuit 912 that includes the radio receiver front end 375, mixing module 320, and/or corresponding methods in accordance with FIGS. 1-16, and a digital audio processing integrated circuit 914. In this embodiment, the radio signal decoder integrated circuit 912 is operably coupled to a crystal oscillator circuit 930 and an antenna structure 934. The crystal oscillation circuit 930 is operably coupled to a crystal and produces therefrom a reference oscillation 904.

The antenna structure 934 includes an antenna, a plurality of capacitors and an optional inductor coupled as shown. The received radio signal 916 is provided from the antenna structure 934 to the radio signal decoder integrated circuit 912. The radio signal decoder integrated circuit 912 converts the received radio signal 916 into audio channel signals 918.

The digital audio processing integrated circuit 914, via a DC-DC converter, generates an input/output (I/O) dependent supply voltage 924-1 and an integrated circuit (IC) dependent voltage 924-2 that are supplied to the radio signal decoder IC 912. In one embodiment, the I/O dependent voltage 924-1 is dependent on the supply voltage required for input/output interfacing of the radio signal decoder IC and/or the digital audio processing IC 914 (e.g., 3.3 volts) and the IC dependent voltage 924-2 is dependent on the IC process technology used to produce integrated circuits 912 and 914.

The interface between the integrated circuits 912 and 914 further includes a bi-directional interface 936. Such an interface may be a serial interface for the integrated circuits 912 and 914 to exchange control data and/or other type of data. In one embodiment, the bi-directional interface 936 may be one or more serial communication paths. System clock 922 in FIG. 18 is operably coupled to the crystal oscillator circuit 930 so that a clock is provided to digital audio processing IC 914 for use in signal processing functions. As one or ordinary skill in the art will appreciate, other serial transmission protocols may be used for the bi-directional interface 936 and the bi-directional interface 936 may include one or more serial transmission paths.

Figure 19:
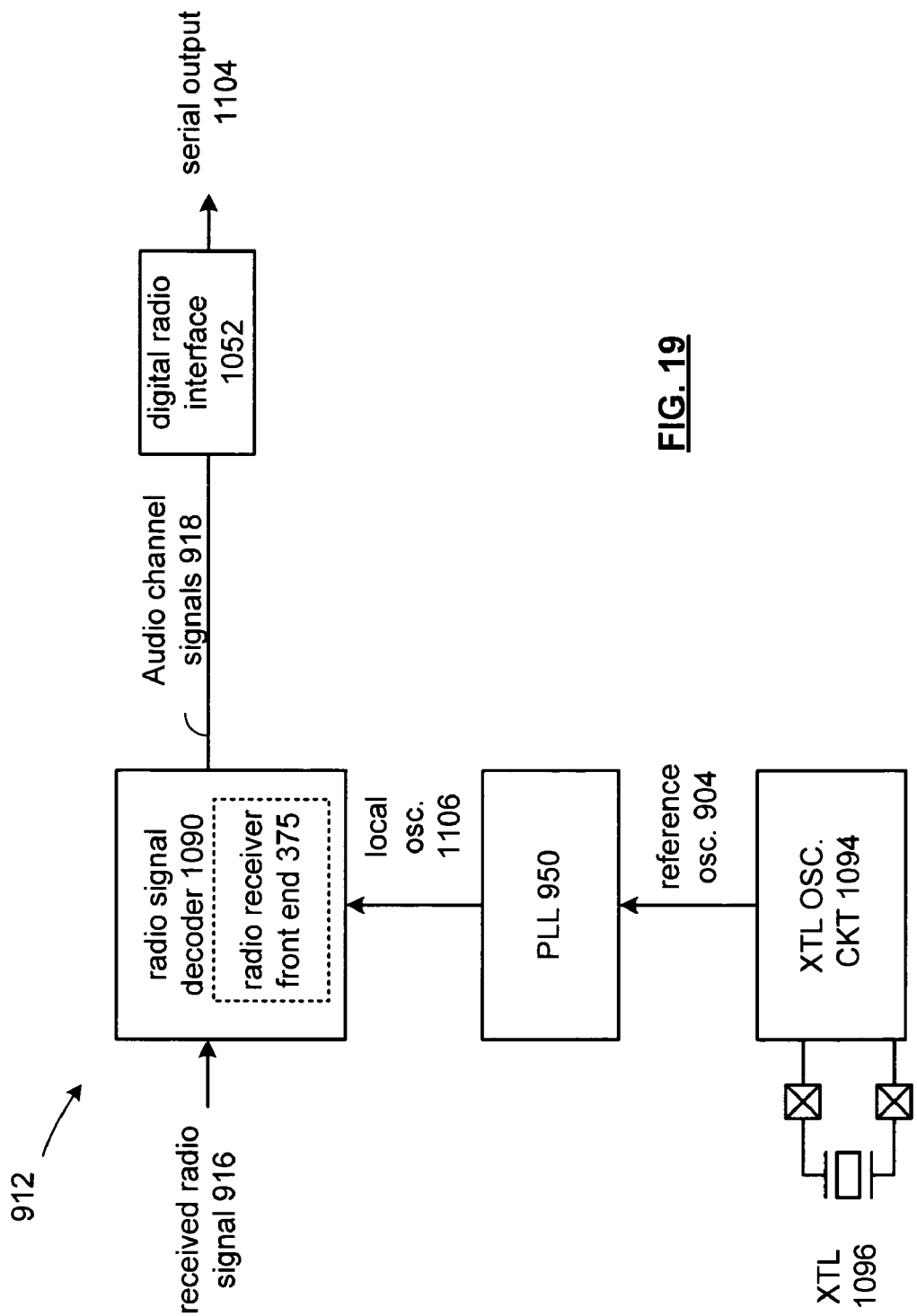
FIG. 19 presents a schematic block diagram of a radio signal decoder in accordance with an embodiment of the present invention.

FIG. 19 presents a schematic block diagram of a radio signal decoder in accordance with an embodiment of the present invention. In particular, an implementation of embodiment of the radio signal decoder integrated circuit 912 is presented that includes the digital radio interface 1052, a crystal oscillation circuit (XTL OSC CKT) 1094, a phase locked loop (PLL) 950 and a radio signal decoder 1090. Radio signal decoder 1090 includes the radio receiver front end 375, programmable sample rate ADC 102, and/or corresponding method in accordance with FIGS. 1-17. The crystal oscillation circuit 1094 is operably coupled, via integrated circuit pins, to an external crystal 1096 to produce a reference oscillation 904. The rate of the reference oscillation 904 is based on the properties of the external crystal 1096 and, as such, may range from a few kilo-Hertz to hundreds of mega-Hertz.

The phase locked loop 950 produces a local oscillation 1106 from the reference oscillation 904. The rate of the local oscillation corresponds to a difference between an intermediate frequency (IF) and a carrier frequency of the received radio signal 916. For instance, if the desired IF is 2 MHz and the carrier frequency of the received radio signal 916 is 101.5 MHz, the local oscillation is 99.5 MHz (i.e., 101.5 MHz-2 MHz). As one of ordinary skill in the art will appreciate, the intermediate frequency may range from DC to a few tens of MHz and the carrier frequency of the received radio signal 916 is dependent upon the particular type of radio signal (e.g., AM, FM, satellite, cable, etc.). The local oscillation may be equal the received radio signal carrier frequency minus the IF or equal to the received radio signal carrier frequency plus the IF.

The radio signal decoder 1090 converts the received radio signal 916, which may be an AM radio signal, FM radio signal, satellite radio signal or cable radio signal, into the audio signals 918 in accordance with the local oscillation 1106. The radio signal decoder 1090 provides the audio channel signals to the digital radio interface 1052 for outputting via a serial output 1104. Note that the digital radio interface 1052 may also carry control information, status information or other information necessary for radio signal decoder IC 912 to function correctly with digital audio processing IC 914. The serial output 104 may include one or more serial input/output connections.

Figure 20:
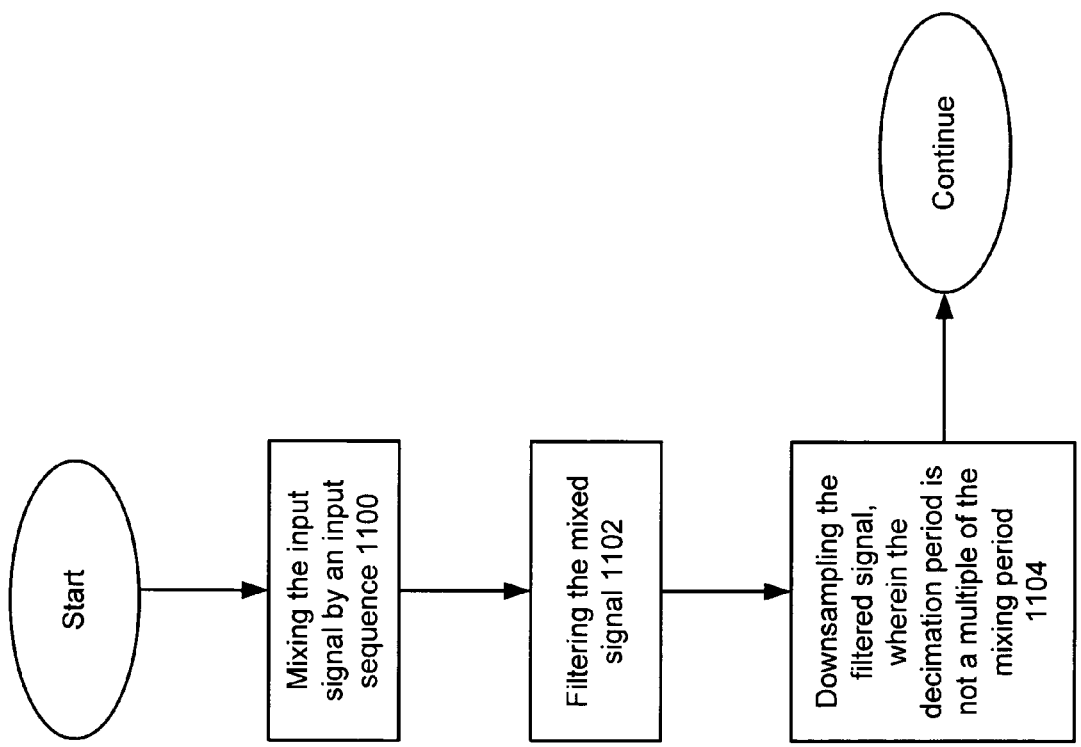
FIG. 20 presents a flowchart representation of a method in accordance with an embodiment of the present invention.

FIG. 20 presents a flowchart representation of a method in accordance with an embodiment of the present invention. In particular, a method of receiving an input signal is presented in accordance with the embodiments of FIGS. 1-19. In step 1100 the input signal is mixed by at least one mixing sequence to produce a mixed signal. In step 1102 the mixed signal is filtered to produce a filtered signal. In step 1104 the filtered signal is downsampled to produce a decimated signal, the decimated signal having a decimation period, wherein the decimation period is not a multiple of the mixing period. In accordance with an embodiment of the present invention, the decimation period is greater than the mixing period. In an alternative embodiment of the present invention, the decimation period is less than the mixing period.

In an embodiment of the present invention, the at least one mixing sequence includes an in-phase mixing sequence and a quadrature phase mixing sequence. The mixed signal includes an in-phase mixed signal and a quadrature phase mixed signal and wherein the step of mixing the input signal includes mixing the input signal by the in-phase mixing sequence and the quadrature phase mixing sequence to produce the in-phase mixed signal and the quadrature phase mixed signal respectively. In addition, the filtered signal includes an in-phase filtered signal and a quadrature phase filtered signal, and wherein the step of filtering the mixed signal includes filtering the in-phase mixed signal to produce the in-phase filtered signal and filtering the quadrature phase mixed signal to produce the quadrature phase filtered signal. Further, the decimated signal includes an in-phase decimated signal and a quadrature phase decimated signal, and wherein the step of decimating the filtered signal includes decimating the in-phase filtered signal to produce the in-phase decimated signal and decimating the quadrature phase filtered signal to produce the quadrature phase decimated signal.

Figure 21:
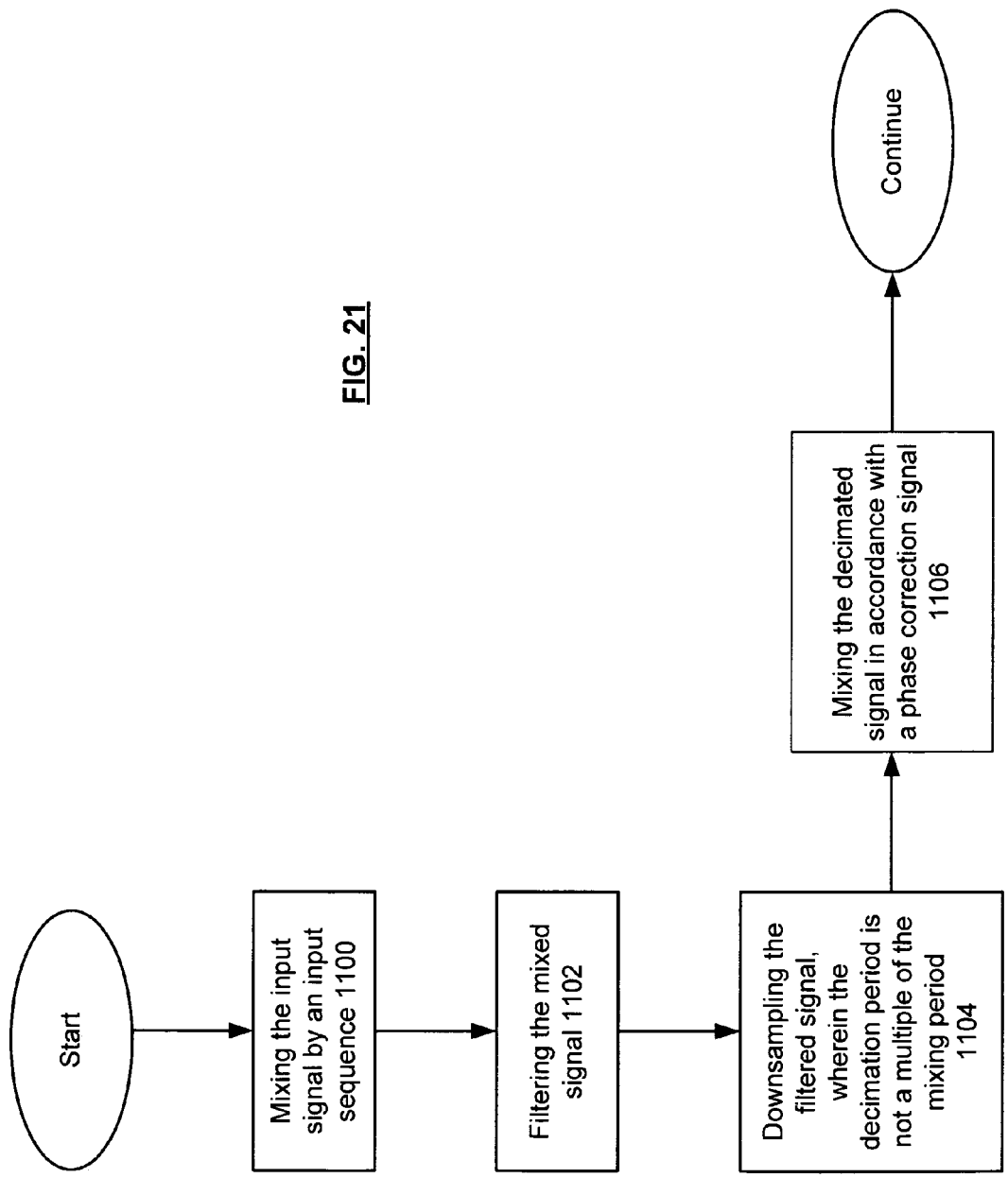
FIG. 21 presents a flowchart representation of a method in accordance with an embodiment of the present invention.

FIG. 21 presents a flowchart representation of a method in accordance with an embodiment of the present invention. In particular, a method of receiving an input signal is presented in accordance with the embodiments of FIGS. 1-19. In various embodiments of the present invention, a phase correction is introduced. In an embodiment of the present invention step 1106 is included for mixing the decimated signal in accordance with a phase correction signal. In an alternative embodiment, the step of filtering includes correcting the phase of the mixed signal. In a further embodiment, the step of decimating includes correcting the phase of the filtered signal.

In an embodiment of the present invention, the decimated signal includes an in-phase decimated signal and a quadrature phase decimated signal. In this embodiment, the step of mixing the decimated signal in accordance with a phase correction signal includes mixing the in-phase decimated signal by an in-phase phase correction signal and mixing the quadrature phase decimated signal by a quadrature phase correction signal, to produce both an in-phase and quadrature-phase phase corrected output.

While the steps of FIGS. 20 and 21 have been presented linearly and in a particular sequence, other sequencing and the concurrent performance of one or more steps are likewise possible within the broad scope of the present invention.

Figure 22:
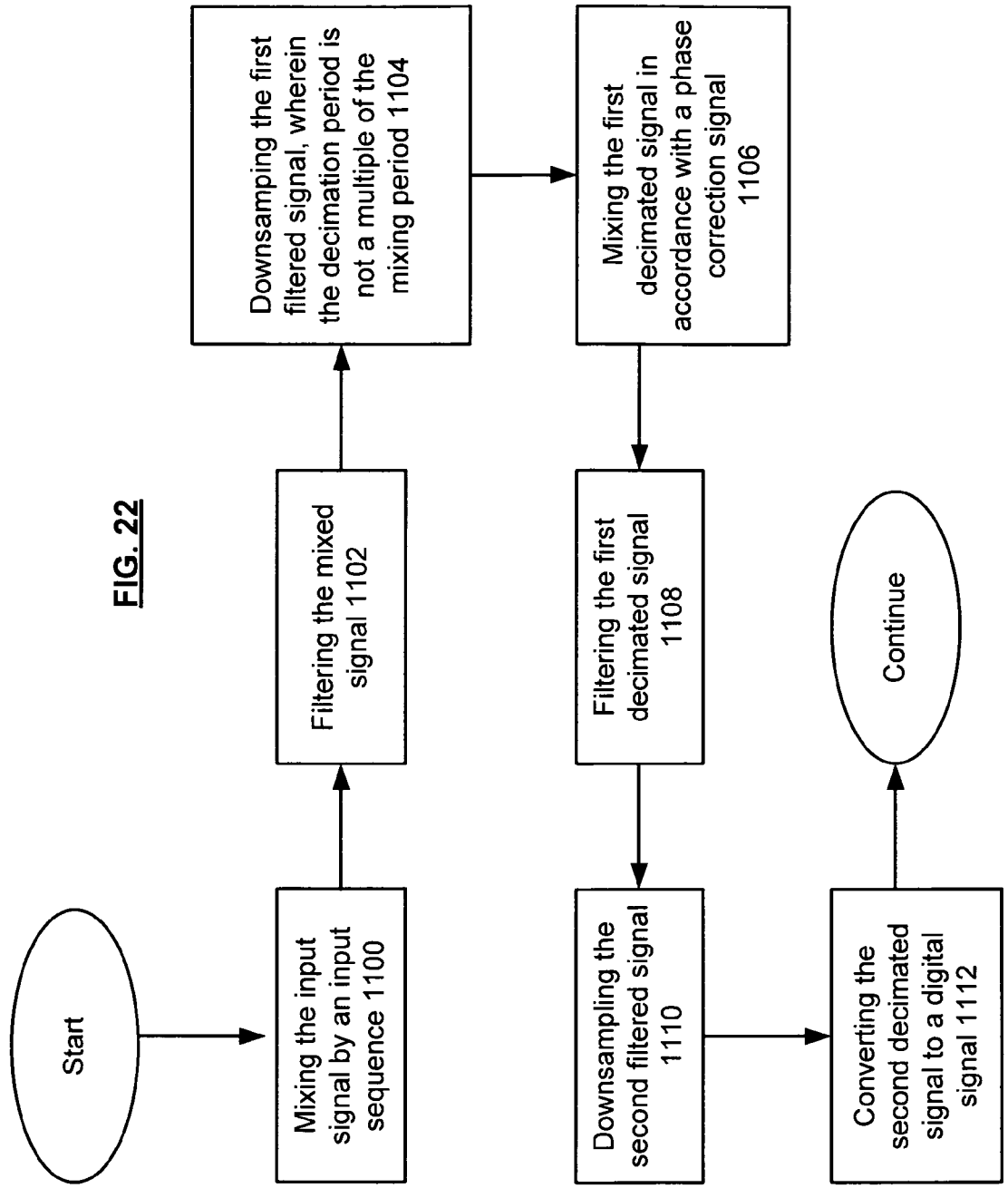
FIG. 22 presents a flowchart representation of a method in accordance with an embodiment of the present invention.

FIG. 22 presents a flowchart representation of a method in accordance with an embodiment of the present invention. In particular, a method of receiving an input signal is presented in accordance with the embodiments of FIGS. 1-19. In step 1100 the input signal is mixed by at least one mixing sequence to produce a mixed signal. In step 1102 the mixed signal is filtered to produce a first filtered signal. In step 1104 the first filtered signal is downsampled to produce a first decimated signal, the first decimated signal having a decimation period, wherein the decimation period is not a multiple of the mixing period. In accordance with an embodiment of the present invention, the decimation period is greater than the mixing period. In an alternative embodiment of the present invention, the decimation period is less than the mixing period. In an embodiment of the present invention, the method further includes step 1106 for mixing the decimated signal in accordance with a phase correction signal and step 1108 for filtering the first decimated signal to produce a second filtered signal. In step 1110, the second filtered signal is decimated to produce a second decimated signal. In step 1112 the second decimated signal is A-D converted to produce a digital signal.

FIG. 23 presents a flowchart representation of a method in accordance with an embodiment of the present invention. In particular, a method for mixing an analog input signal with an oscillation is presented. In step 1200 a mixing sequence is generated, the mixing sequence having a sample period and including a sequence of sample positions and a sequence of scale factors, wherein the sequence of scale factors is based on the oscillation. In step 1202 a plurality of samples of the analog input signal are generated in response to a mixing sequence, wherein the sequence of sample positions has a first order for a first sample interval, and a second order for a second sample interval, wherein the length of first sample interval and the length of the second sample interval is equal to a sequence period, and wherein the first order is different from the second order. In an embodiment of the present invention, the sequence of sample positions repeats at a sample position period greater than the sample interval.

In further embodiment of the present invention, the plurality of samples of the analog input signal include a first plurality of in-phase samples and a second plurality of quadrature phase samples. Further, the step of generating a plurality of samples includes generating an in-phase sample during the first sample interval and a quadrature phase sample during the second sample interval.

In preferred embodiments, the various circuit components are implemented using 0.35 micron or smaller CMOS technology. Provided however that other circuit technologies, both integrated or non-integrated, may be used within the broad scope of the present invention. Likewise, various embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

Thus, there has been described herein an apparatus and method, as well as several embodiments including a preferred embodiment, for implementing a mixing module and a receiver. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A mixing module for mixing an analog input signal with an oscillation, comprising:
a plurality of switched sample modules operably coupled to the analog input signal for generating a corresponding plurality of samples of the analog input signal in response to a control signal, wherein the plurality of samples of the analog input signal include a first plurality of in-phase samples and a second plurality of quadrature phase samples and wherein at least one of the plurality of switched sample modules includes a switched capacitor circuit; and
a control module operably coupled to a sampling clock, for generating a mixing sequence and generating a control signal based on the mixing sequence, the control signal including a sequence of sample positions and a sequence of scale factors, the sequence of scale factors having a period that is based on a period of the oscillation;
wherein the sampling clock has a sample period and wherein the sequence of sample positions repeats at a sample position period greater than a sample interval, the sample interval equal to the sample period times the number of the plurality of switched sample circuits.

2. The mixing module of claim 1 further comprising a switched capacitor filter, operably coupled to at least one of the plurality of switched sample modules.

3. The mixing module of claim 2 wherein the switched capacitor filter includes an infinite impulse response filter.

4. The mixing module of claim 3 wherein the switched capacitor filter includes a switched capacitor feedback network.

5. The mixing module of claim 4 wherein the switched capacitor filter time shares the switched capacitor feedback network.

6. The mixing module of claim 1 wherein the sequence of sample positions has a first order for a first sample interval, and a second order for a second sample interval, wherein the length of the first sample interval is equal to the length of the second sample interval, and wherein the first order is different from the second order.

7. The mixing module of claim 6 wherein at least one of the plurality of switched sample modules has a first position in the first order and a second position in the second order, and wherein the first position is different from the second position.

8. The mixing module of claim 6 wherein at least one of the plurality of switched sample modules generates an in-phase sample during the first sample interval and a quadrature phase sample during the second sample interval.

9. A mixing module for mixing an analog input signal with an oscillation, comprising:
- a plurality of switched sample modules operably coupled to the analog input signal for generating a corresponding plurality of samples of the analog input signal in response to a control signal; and
- a control module operably coupled to a sampling clock, for generating a mixing sequence and generating a control signal based on the mixing sequence, the control signal including a sequence of sample positions and a sequence of scale factors, the sequence of scale factors having a period that is related to a period of the oscillation;
- wherein the sampling clock has a sample period and wherein the sequence of sample positions repeats at a sample position period greater than a sample interval, the sample interval equal to the sample period times the number of the plurality of switched sample circuits.

10. The mixing module of claim 9 wherein at least one of the plurality of switched sample modules includes a switched capacitor circuit.

11. The mixing module of claim 9 wherein at least one of the plurality of switched sample modules includes a finite impulse response filter.

12. The mixing module of claim 11 further comprising a switched capacitor filter, operably coupled to at least one of the plurality of switched sample modules.

13. The mixing module of claim 12 wherein the switched capacitor filter includes a infinite impulse response filter.

14. The mixing module of claim 13 wherein the switched capacitor filter includes a switched feedback network.

15. The mixing module of claim 14 wherein the switched capacitor filter time shares a switched capacitor feedback network.

16. The mixing module of claim 9 wherein the sequence of sample positions has a first order for a first sample interval, and a second order for a second sample interval, wherein the length of the first sample interval is equal to the length of the second sample interval, and wherein the first order is different from the second order.

17. The mixing module of claim 16 wherein at least one of the plurality of switched sample modules has a first position in the first order and a second position in the second order, and wherein the first position is different from the second position.

18. The mixing module of claim 16 wherein the plurality of samples of the analog input signal include a first plurality of in-phase samples and a second plurality of quadrature phase samples.

19. The mixing module of claim 18 wherein at least one of the plurality of switched sample modules generates an in-phase sample during the first sample interval and a quadrature phase sample during the second sample interval.

20. A method for mixing an analog input signal with an oscillation, comprising:
- generating, by at least one control module, a mixing sequence having a sample period, the mixing sequence including a sequence of sample positions and a sequence of scale factors, the sequence of scale factors based on the oscillation;
- generating, by at least one sampler, a plurality of samples of the analog input signal in response to a mixing sequence; and
- wherein the sequence of sample positions has a first order for a first sample interval, and a second order for a second sample interval, wherein the length of first sample interval is equal to the length of the second sample interval, and wherein the first order is different from the second order.

21. The method of claim 20 wherein the sequence of sample positions repeats at a sample position period greater than the first sample interval.

22. The mixing module of claim 20 wherein the plurality of samples of the analog input signal include a first plurality of in-phase samples and a second plurality of quadrature phase samples.

23. The mixing module of claim 22 wherein the step of generating, by at least one sampler, a plurality of samples includes using a switched capacitor to generate an in-phase sample during the first sample interval and a quadrature phase sample during the second sample interval.

24. A radio receiver front end for receiving an analog radio signal, the radio receiver front end receiver comprising:
- a low noise amplifier for amplifying the analog radio signal to produce an amplified radio signal;
- a plurality of switched sample modules operably coupled to the amplified radio signal for generating a corresponding plurality of samples of the amplified radio signal in response to a control signal; and
- a control module operably coupled to a local oscillator signal, for generating a mixing sequence and generating a control signal based on the mixing sequence, the control signal including a sequence of sample positions and a sequence of scale factors, the sequence of scale factors based on the local oscillator signal, wherein the local oscillator signal has a local oscillator period and wherein the sequence of sample positions repeats at a sample position period greater than a sample interval, the sample interval equal to the local oscillator period times the number of the plurality of switched sample circuits;
- a first filter, operably coupled to the mixed signal, for filtering the mixed signal to produce a first filtered signal;
- a first downsampler, operably coupled to the first filtered signal, for decimating the first filtered signal to produce a first decimated signal, the first decimated signal having a decimation period;
- a second filter, operably coupled to the first decimated signal, for filtering the first decimated signal to produce a second filtered signal;
- a second downsampler, operably coupled to the second filtered signal for decimating the second filtered signal to produce a second decimated signal; and
- an ADC converter module, operably coupled to the second decimated signal, for converting the second decimated signal to produce a digital signal.

25. The radio receiver front end of claim 24 wherein at least one of the plurality of switched sample modules includes a switched capacitor circuit.

26. The radio receiver front end of claim 24 wherein the second filter includes a switched capacitor filter.

27. The radio receiver front end of claim 24 wherein the second filter includes an infinite impulse response filter.

28. The radio receiver front end of claim 24 wherein the second filter includes a switched capacitor feedback network.

29. The radio receiver front end of claim 24 wherein the sequence of sample positions has a first order for a first sample interval, and a second order for a second sample interval, wherein the length of the first sample interval is equal to the length of the second sample interval, and wherein the first order is different from the second order.

30. The radio receiver front end of claim 29 wherein at least one of the plurality of switched sample modules has a first position in the first order and a second position in the second order, and wherein the first position is different from the second position.

31. The radio receiver front end of claim 29 wherein the plurality of samples of the analog input signal include a first plurality of in-phase samples and a second plurality of quadrature phase samples.

32. The radio receiver front end of claim 31 wherein at least one of the plurality of switched sample modules generates an in-phase sample during the first sample interval and a quadrature phase sample during the second sample interval.

33. The radio receiver front end of claim 24 wherein the second filter includes an in-phase filter submodule and a quadrature filter submodule.

34. The radio receiver front end of claim 33 wherein the in-phase and quadrature phase filter submodules time share a switched capacitor circuit.

* * * * *